United States Patent [19]

Kishimoto et al.

[11] Patent Number: 4,815,107
[45] Date of Patent: Mar. 21, 1989

[54] DIGITAL CODE DECODING APPARATUS

[75] Inventors: Hideo Kishimoto; Keizo Sugita, both of Yokohama; Makoto Yoshitoshi, Zushi, all of Japan

[73] Assignee: Nippon Telegraph and Telephone Corporation, Tokyo, Japan

[21] Appl. No.: 150,342

[22] Filed: Jan. 29, 1988

[30] Foreign Application Priority Data

Feb. 16, 1987 [JP] Japan .................... 62-31640

[51] Int. Cl.$^4$ ............................. H03D 3/00
[52] U.S. Cl. ........................ 375/96; 382/29; 340/146.2; 371/6
[58] Field of Search .............. 375/96, 94, 95, 103, 375/76, 10, 37, 116, 102, 80, 75, 88, 83; 329/104; 328/167, 151, 149; 371/6; 307/260; 364/769, 728; 382/29; 340/146.2; 179/113

[56] References Cited

U.S. PATENT DOCUMENTS 3,187,305  6/1965  Chiang ............................ 382/29
3,192,504  6/1965  Miller ............................. 382/29

Primary Examiner—Benedict V. Safourek
Assistant Examiner—Marianne Huseman
Attorney, Agent, or Firm—Pollock, VandeSande and Priddy

[57] ABSTRACT

A digital code decoding apparatus including a reference waveform storage section which prestores, as reference waveforms, at least m received waveforms corresponding to m possible values of m-value digital codes distorted during transmission, a waveform comparing section which compares at least m reference waveforms read out of the reference waveform storage section and the received waveform, respectively, and a decoded information output section which discriminates one of the reference waveforms which most resembles the received waveform, on the basis of the compared outputs from the waveform comparing section, and outputs, as decoded information, a digital code corresponding to the discriminated reference waveform.

23 Claims, 24 Drawing Sheets

FIG. 1
PRIOR ART
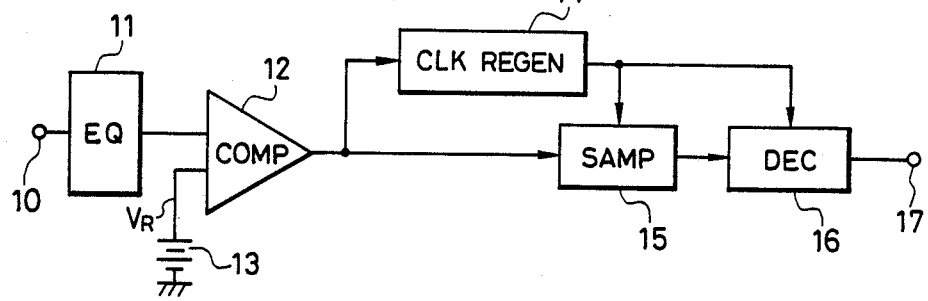
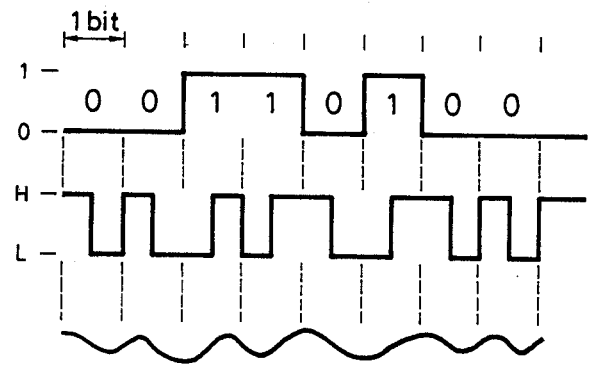
PRIOR ART
FIG. 2A
FIG. 2B
FIG. 2C
FIG. 2D
FIG. 2E
FIG. 2F
FIG. 2G

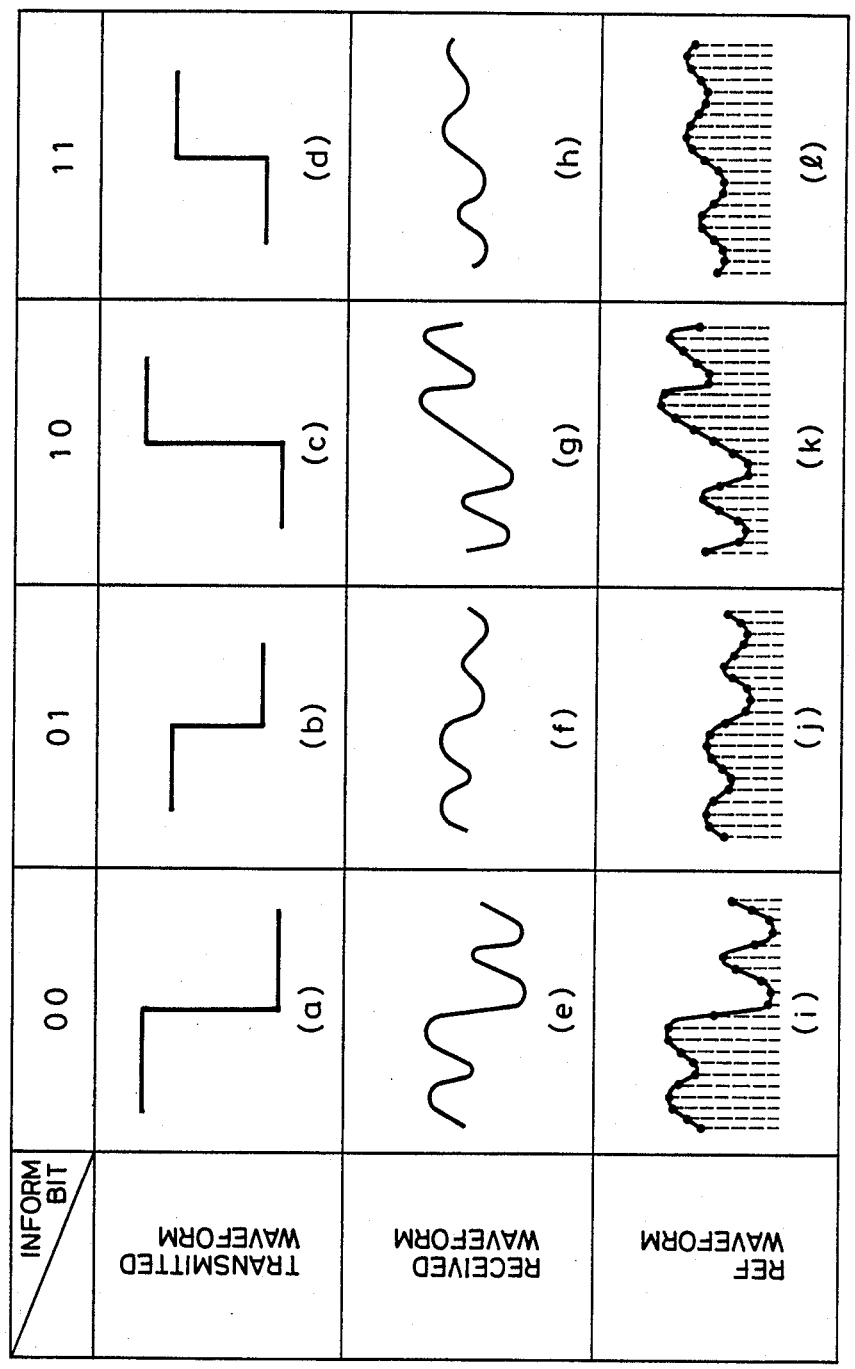

DIGITAL CODE DECODING APPARATUS

BACKGROUND OF THE INVENTION

The present invention relates to a digital code decoding apparatus and, more particularly, to a digital decoding apparatus which is applicable as well to the case where a received waveform is extremely distorted owing to characteristics of a transmission system, for instance, where a so-called eye pattern of the received waveform is not fully open.

FIG. 1 shows an example of a conventional decoding apparatus. For example, in the case of transmitting digital information shown in FIG. 2A, through use of Manchester codes, "0s" in data of the information to be transmitted are each converted to a "high-to-low" form and "1s" to a "low-to-high" form; and such a waveform as shown in FIG. 2B is transmitted. This waveform is transmitted over a line or like transmission system and is distorted by its transmission characteristics to a gently varying waveform as depicted in FIG. 2C. The distorted waveform is received and applied to an input terminal 10, from which it is provided to an equalizer 11 for correction of the transmission distortion of the received waveform. The corrected waveform is compared, by a comparator 12, with a reference voltage $V_R$ from a reference voltage source 13 and shaped into a binary waveform which has high and low levels as depicted in FIG. 2D. The thus shaped waveform is provided to a clock regenerating section 14 and a sampling section 15. Based on changing points in the output waveform from the comparator 12, the clock regenerating section 14 produces at its output a sampling clock which has a frequency that is twice higher than the transmission bit rate and lags by 90° in phase with respect to the changing points as shown in FIG. 2E. The sampling section 15 samples the output waveform from the comparator 12 with a ½ frequency-divided clock of the regenerated clock, regenerating the original transmitted waveform as shown in FIG. 2F. The clock regenerating section 14 usually has an arrangement in which a pulse signal created by applying the received signal to a differentiation circuit is provided to a phase locked loop circuit to obtain a clock synchronized with the changing points in the comparator output waveform and the phase of the thus obtained clock is delayed 180° (i.e., 90° behind the transmitted bit), thereby regenerating the sampling clock. The sampling section 15 can be implemented by a D flip-flop. The sampled output waveform from the sampling section 15 is provided to a decoding section 16, which yields a "0" or "1" depending upon whether the input waveform is "high-to-low" or "low-to-high". In this way, data of the same information as the original transmitted information is produced as shown in FIG. 2G.

In general, in the cases where the transmission distance is long and the transmission line includes bridge taps, the transmission characteristic does not have a flat frequency characteristic and the transmitted waveform is subject to distortion as depicted in FIG. 2C. The transmitted information bits "0" and "1" are "high-to-low" and "low-to-high" in the Manchester code; and therefore when the transmission distortion is not too large, what is called an eye pattern, shown in FIG. 3A, is obtained by superimposing respective bits of the received waveform for the same period of time. Where such an open eye pattern is obtainable, it is possible to correctly determine whether each of the received waveform is "high-to-low" or "low-to-high", by suitably selecting the sample points, i.e. timings and the reference voltage $V_R$ for comparison with the received signal level in the comparator 12, as indicated by crosses in FIG. 3A. When the transmission distortion is very large, however, the eye pattern does not open as shown in FIG. 3B, and the transmitted information cannot be reproduced correctly. Where the distortion by the transmission system is large, as mentioned above, it is customary in the prior art to employ a method in which the transmission characteristic is compensated for by the equalizer 11 for opening the eye pattern, as shown in FIG. 3A. The equalizer is a filter which has a characteristic inverse from the frequency characteristic of the transmission system, and this filter can be implemented by both analog and digital filters.

The equalizer employing an analog filter, for correcting the transmission characteristic, is formed by one or more LC filters or RC active filters.

The equalizer employing a digital filter also corrects the transmission characteristic by a filter whose characteristic is inverse therefrom, as is the case with the analog filter, but the method of implementing the filter differs from that in the case of the analog filter. FIG. 4 shows an example of the arrangement of the digital filter. A waveform applied to the input terminal 10 is sampled by an A/D converter 11a and thereby digitized, and the digital output is applied to a plurality of cascade-connected delay circuits 11b, in each of which it is delayed by the sampling interval. The output of the A/D converter 11a and the output of each delay circuit 11b are provided to a multiplier 11d, wherein they are multiplied by a value stored in a coefficient register 11c, and the respective multiplied outputs are added together in an adder 11e, the added output of which is converted by a D/A converter 11f into analog form. This filter performs processing in the time domain. A filter of a desired characteristic can be constituted by properly setting the number of stages of the delay circuits 11b, the coefficient registers 11c and the multipliers 11d, and the values of filter coefficients to be set in the registers 11c.

In the conventional decoding apparatus provided with the equalizer, shown in FIG. 1, it is necessary to determine the coefficient of each stage of the filter depicted in FIG. 4 such that complex transmission characteristics may be corrected. To determine the filter coefficients, a predetermined bit pattern (hereinafter referred to as a training pattern) is transmitted from the transmitting side, for example, prior to the transmission of information, and the decoding apparatus of the receiving side determines the filter coefficients so that a correct bit pattern may be decoded from the received signal. In such training of the decoding apparatus in accordance with the transmission characteristic, the conventional equalizer calls for the transmission of training data of more than 1K-bit or so. This will seriously impair the efficiency of transmitting a short packet a bus-type LAN or the like, for example. The reason for this is that since the transmission characteristic varies with the position on the bus where a terminal of each transmitting side is connected thereto, the reception of information must be preceded by training of the receiving characteristic for each of the different transmitting sides. Another reason is that the information to be transmitted is as short as dozens to hundreds of bits in almost all cases. Accordingly, the transmission of 1K-bit or more data for training is undesirable in terms of the utilization efficiency of the bus.

For the correction of complicated transmission characteristics, the number of stages of the filter shown in FIG. 4 inevitably increases, besides each stage of the filter needs to use the multiplier 11d involving a large amount of hardware. Accordingly, the amount of hardware necessary for the entire filter is so large that its economical construction is difficult. Furthermore, the use of the multiplier 11d constitutes an obstacle to high-speed processing, making high-speed transmission difficult.

In the case where the characteristic of the transmission line is poor and the received waveform is seriously deteriorated as mentioned above, the conventional method for compensating for the characteristic of the transmission line through use of an equalizer possesses the defects of poor transmission efficiency, difficulty in high-speed transmission and an increase in the amount of hardware of the equalizer which introduces difficulty in economical construction of the decoder.

SUMMARY OF THE INVENTION

It is therefore an object of the present invention to provide a digital code decoding apparatus which is applicable to a transmission system in which a transmitted waveform is seriously degraded and which requires less hardware than the conventional decoding apparatus employing an equalizer formed by a digital filter and permits high-speed transmission.

Another object of the present invention is to provide a digital code decoding apparatus in which the bit pattern for training the receiving characteristic is short and consequently the time for training is short.

According to the present invention, the digital code decoding system includes timing signal generating means for deriving from the received signal a timing signal synchronized therewith, reference waveform storage means for storing, as reference waveforms, at least two standard received waveforms corresponding to digital information to be transmitted, waveform comparing means for comparing the waveform of the received signal with each of the above-mentioned at least two reference waveforms, and a decoded information output section which outputs digital information corresponding to that one of the reference waveforms which is closer to the received waveform.

The digital code decoding apparatus of the present invention includes, as required, waveform selecting means which stores a plurality of reference waveforms in the reference waveform storage means, for each of different codes, and selects the reference waveform to be read out therefrom, through utilization of the preceding decoded result.

The digital code decoding apparatus further includes, as required, waveform training means whereby received waveforms of respective information bits of a predetermined bit pattern are successively written into the reference waveform storage means.

BRIEF DESCRIPTION OF THE DRAWINGS

FIG. 1 is a block diagram showing a conventional decoding apparatus provided with an equalizer;

FIGS. 2A through 2G are waveform diagrams, for explaining the operation of the decoding apparatus depicted in FIG. 1;

FIG. 11 is a waveform diagram, for explaining the operation of the embodiment depicted in FIG. 10;

DESCRIPTION OF THE PREFERRED EMBODIMENTS

Figure 3A:
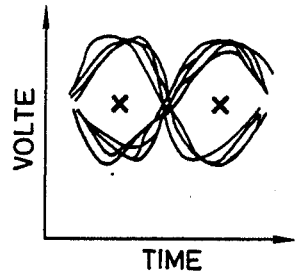
FIGS. 3A and 3B are diagrams, for explaining an eye pattern of a received waveform.
Figure 3B:
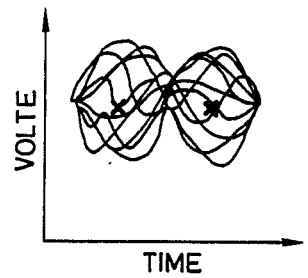
Figure 4:
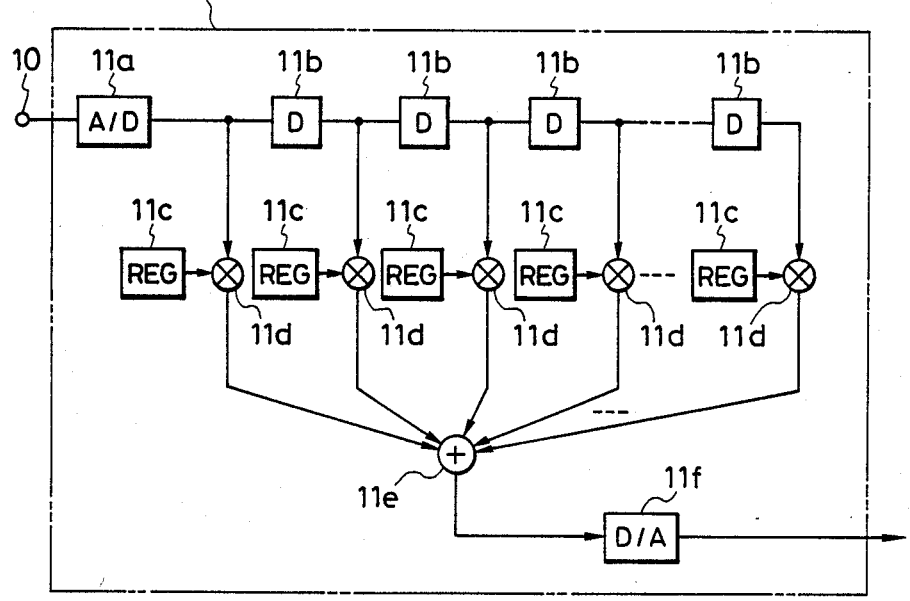
FIG. 4 is a block diagram showing an example of the arrangement of the equalizer used in FIG. 1.
Figure 5:
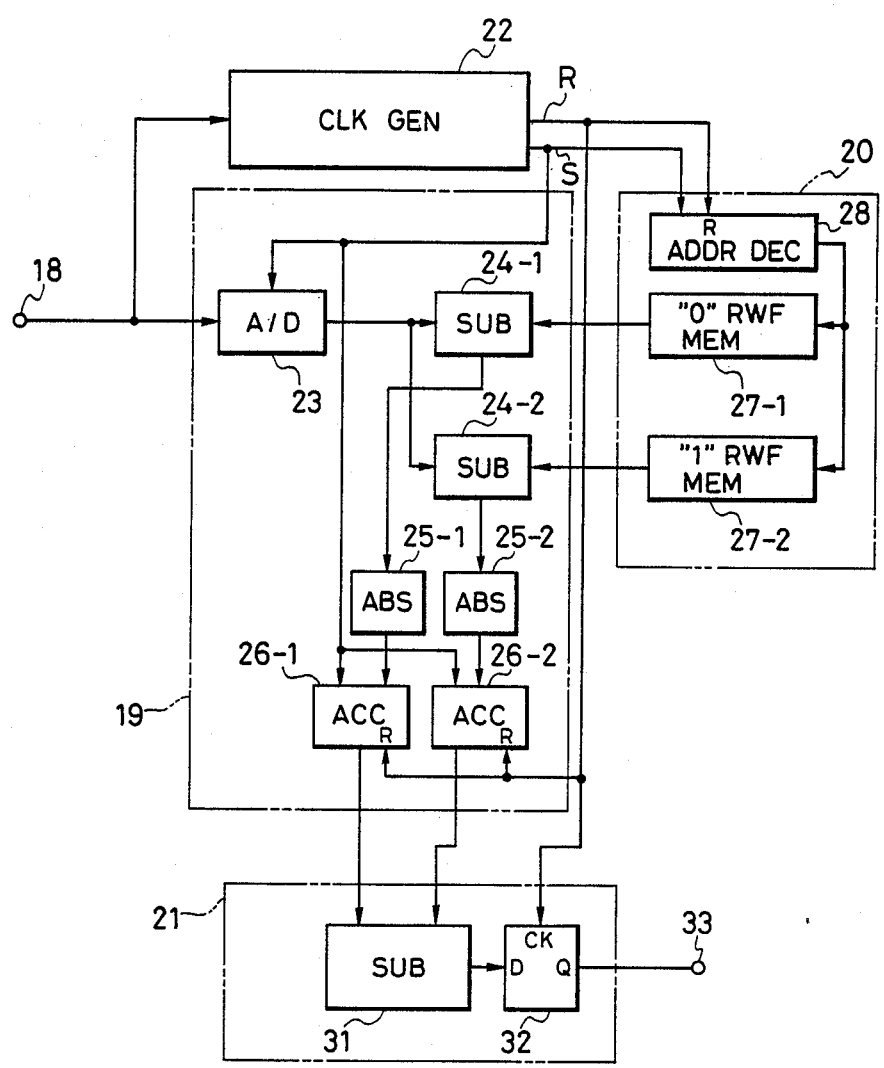
FIG. 5 is a block diagram illustrating an embodiment of the decoding apparatus of the present invention.

FIG. 5 illustrates in block form an embodiment of the decoding apparatus of the present invention. In rough terms, the decoding apparatus comprises a clock generating section 22 which reproduces a clock signal from the received signal and derives various timing signals from the clock signal; a reference waveform storage section 20 in which reference waveforms for comparison use have been stored; a waveform comparing section 19 for comparing the received waveform with the reference waveforms; and a decoded information output section 21 which reproduces transmitted information from the comparison result and outputs the reproduced information. The waveform comparing section 19 is made up of an A/D converter 23 which samples the received signal with a sampling signal S produced in the clock generating section 22, for conversion into a digital signal, subtractors 24-1 and 24-2 which subtract the reference waveforms and the digitized received waveform one from the other, respectively, absolute value circuits 25-1 and 25-2 which output the absolute values of the subtracted results, i.e. the differences between the reference waveforms and the received waveform, and accumulators 26-1 and 26-2 which successively add the differences between the reference waveforms and the received one, provided in the form of absolute values, and store them in registers, respectively. The reference waveform storage section 20 is composed of first and second reference waveform memories (or "0" and "1" reference waveform memories) 27-1 and 27-2 in which digital data, obtained by sampling at n points received waveforms corresponding to information "0" and "1" to be transmitted, have been stored as reference waveforms, respectively, and an address decoder 28 which counts up with the sampling signal S from the clock generating section 22 and is reset by a reset signal R, for creating address data for sequential readout of the reference waveform data. The decoded information output section 21 includes a subtractor 31 for comparing the outputs from the two accumulators 26-1 and 26-2 and a D flip-flop 32 for holding a borrow output from the subtractor 31, and provides it as decoded information at an output terminal 33.

Figure 6A:
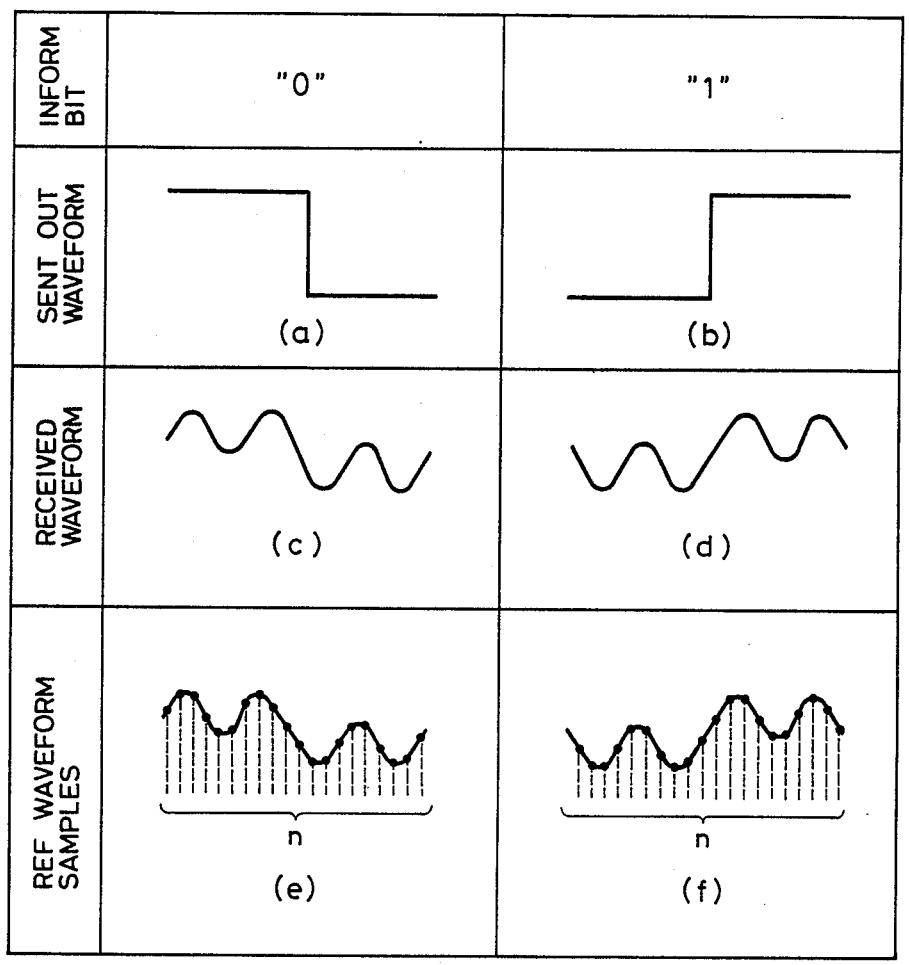
FIGS. 6A to 6C are waveform diagrams, for explaining the operation of the decoding apparatus shown in FIG. 5.

Let it be assumed, for instance, that information bits "0" and "1" shown in (a) and (b) of FIG. 6A, transmitted as Manchester codes, were received, at an input terminal 18, in such waveforms as shown in (c) and (d) of FIG. 6A, respectively. In the first and second reference waveform memories 27-1 and 27-2 there have been prestored, as reference waveforms, typical received waveforms corresponding to the information bits "0" and "1" distorted by the transmission characteristic of the transmission line connected to the decoding apparatus. The reference waveforms corresponding to the information bits "0" and "1" are such, for example, as shown in (e) and (f) of FIG. 6A, and they are each prestored as n samples of digital data.

Upon application of the received signal to the input terminal 18, the clock generating section 22 detects the rise-up of its waveform and starts to create the sampling signal S of a frequency n times higher than the transmitted information bit rate and the reset signal R which is output at the end of each transmitted information bit. The sampling signal S is a rectangular wave with a duty cycle of 50%, and the reset signal R is an impulse of a small width which is output upon detecting the rise-up of the received waveform and thereafter output at the end of each bit. Such a clock generating section 22 can easily be formed using, for example, an LC circuit, PLL circuit, or the like.

Having detected the rise-up of the received waveform, the clock generating section 22 yields the reset signal R, by which the address decoder 28 is reset, and the first and second reference waveform memories 27-1 and 27-2 each provide a first one of n samples of reference waveform data to the subtractors 24-1 and 24-2. The accumulators 26-1 and 26-2 are also reset. Simultaneously with this, the sampling signal S rises up, by which the received waveform is sampled into digital form in the A/D converter 23. The digital data thus obtained is applied to the subtractors 24-1 and 24-2. Thereafter, upon each application of the sampling signal S, the address of the decoder 28 is incremented by one and the succeeding reference waveform data is read out of each of the first and second reference waveform memories 27-1 and 27-2. At the same time, sample data of the received waveform is provided from the A/D converter 23, and these data are applied to the subtractors 24-1 and 24-2. The subtractor 24-1 obtains the difference between the sample data of the received waveform and the reference waveform of the information bit "0" and the subtractor 24-2 the difference between the sample data of the received waveform and the reference waveform of the information bit "1". These difference signals thus obtained are converted, by the absolute value circuits 25-1 and 25-2, into positive values, which are provided to the accumulators 26-1 and 26-2. Upon each fall of the sampling signal S, the accumulators 26-1 and 26-2 cumulatively add to the values of their internal registers the difference value from the absolute value circuits 25-1 and 25-2, respectively. Upon the next rise-up of the sampling signal S, the address of the address decoder 28 is incremented by one and the next data of each reference waveform is output.

Figure 6B:
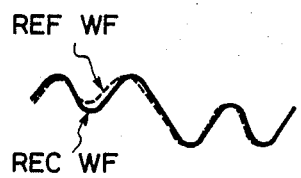
Figure 6C:
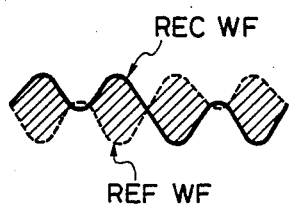

The accumulated values of the registers in the accumulators 26-1 and 26-2 are provided to the subtractor 31, in which the output of the accumulator 26-1 is subtracted from the output of the accumulator 26-2, and the resulting borrow output is applied to the D flip-flop 32. In this instance, the subtractor 31 yields a "0" or "1", depending upon whether the output of the accumulator 26-1 is smaller or larger than the output of the accumulator 26-2. In other words, the subtractor 31 outputs digital information corresponding to that one of the reference waveforms whose area is closer to that of the received waveform. However, the compared output is latched in the D flip-flop 32 and provided, as decoded information, at an output terminal 33 only when the reset signal R is applied to the D flip-flop 32. By sampling the differences between the received waveform and the reference waveforms n times and accumulating the sampled values as mentioned above, the differences in area between the received waveform of one information bit and the "0" and "1" reference waveforms are accumulated in the accumulators 26-1 and 26-2, respectively. These values are each close to zero when the received waveform is compared with the reference waveform of the same information as that of the former, but become very large when the received waveform is compared with the reference waveform different in information from the former. For example, when the received information shown in (c) of FIG. 6A, corresponding to the transmitted information "0" shown in (a) of FIG. 6A, is applied to the input terminal 18, the difference in area between the received waveform indicated by the solid line in FIG. 6B and the "0" reference waveform read out of the first reference waveform memory 27-1, indicated by the broken line in FIG. 6B, is very small. On the other hand, the difference in area between the received waveform and the "1" reference waveform read out of the second reference waveform memory 27-2 is very large, as shown in FIG. 6C. Accordingly, the original information can be reproduced by outputting the information corresponding to the smaller one of the values stored in the accumulators 26-1 and 26-2. As described above, at the time point of the n-th accumulation the clock generating section 22 yields the reset signal R and the reproduced information, i.e. the borrow output of the subtractor 31 is latched in the D flip-flop 32, from which the decoded received information is provided to the output terminal 33. At the same time, the reset signal R resets the accumulators 26-1 and 26-2 and the address decoder 28, returning the circuitry to its initial state for similar processing of the received waveform for the next information bit.

While in this embodiment the subtractor 31 compares the outputs of the accumulators 26-1 and 26-2, it is needless to say that the comparison can be achieved by use of a digital comparator equipped with a magnitude discriminating function.

As described above, according to this embodiment, even if the distortion of the received waveform is so large that an eye pattern does not open, the original information can be reproduced by comparing the received waveform with the reference waveforms, without the necessity of equalizing the transmission characteristic. The circuitry can be constituted by accumulators and subtractors and does not call for any multipliers and dividers, and hence is economically advantageous and capable of high-speed processing.

Figure 7:
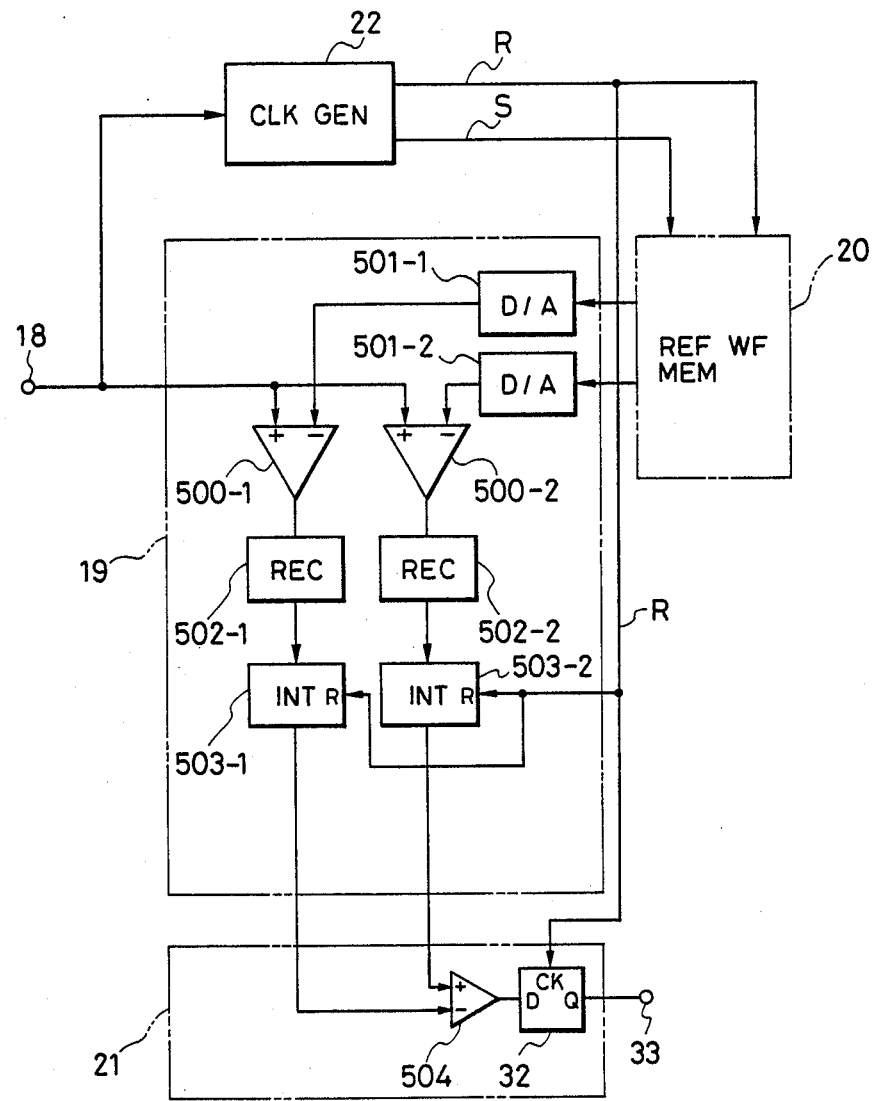
FIG. 7 is a block diagram illustrating another embodiment of the decoding apparatus of the present invention.

In the embodiment described above in connection with FIG. 5, the waveform comparing section 19 is made up of digital circuits, but it may also be formed by analog circuits, as shown in FIG. 7. The clock generating section 22 and the reference waveform storage section 20 are identical in construction with those in FIG. 5. The A/D converter 23 in FIG. 5 is omitted but instead D/A converters 501-1 and 501-2 are provided by which the reference waveforms read out of the reference waveform storage section 20 are converted to analog form. Furthermore, the subtractors 24-1 and 24-2 are replaced by differential amplifiers 500-1 and 500-2, the absolute value circuits 25-1 and 25-2 are replaced by full-wave rectifiers 502-1 and 502-2, and the accumulators 26-1 and 26-2 are replaced by integrators 503-1 and 503-2. Each analog circuit in the waveform comparing section in FIG. 7 merely performs the same operation as that of the corresponding digital circuit in FIG. 5 on an analog-wise basis; therefore, no description will be given of its operation. Similarly, a comparator 504 in the decoded information output section in FIG. 7 merely performs analog-wise the operation of the subtractor 31 in FIG. 5.

Even if the waveform comparing section 19 and the decoded information output section 21 are formed by analog circuits as mentioned above, it is possible to obtain the same function as obtainable with the embodiment of FIG. 5 employing digital circuits. Moreover, when the reference waveform storage section 20 is adapted to store the waveforms in analog form such as resistance or voltage values, the D/A converters 501-1 and 501-2 can be left out. Even if a desired one or ones of the waveform comparing section 19, the reference waveform storage section 20 and the decoded information output section 21 are formed by either digital or analog circuits, they can be combined through use of A/D and D/A converters.

In the foregoing embodiments, the waveform comparing section 19 constructed in either digital or analog form compares the waveforms for each bit on a time-sequence basis, that is, it accumulates the successively compared results of n samples for each bit, but it can also be so arranged as to store the received waveform for one bit (n samples) for comparison with the reference waveform (n samples) at one time. This can be implemented using a storage circuit for storing n samples of the received waveform, 2n subtractors, 2n absolute value circuits, and two adders for adding their outputs by steps of n, respectively.

Although the above the method of comparison by the waveform comparing section 19 has been described as obtaining the differences between the received waveform and the reference waveforms, it is also possible to utilize any different method of comparison, such as, for example, a method which involves obtaining the square of each difference.

Moreover, these functions can also be implemented by software, though not shown. In this case, a microcomputer or digital signal processor is employed which comprises D/A converters, CPUs, ROMs, RAMs, I/O equipments, etc. The reference waveform storage section is formed by some of the ROMs and RAMs of the microcomputer or digital signal processor, and the waveform comparing section and a digital information output section can be implemented by programs.

As described above, various arrangements can be utilized for the waveform comparing section 19, the reference waveform storage section 20 and the decoded information output section 21.

Next, a description will be given of a method of producing the reference waveforms which are stored in the reference waveform storage section 20. Where the characteristic of the transmission system is fixed, received waveforms premeasured for the transmission of information bits "0" and "1" over the transmission system are prestored in ROMs or the like. In the case where the characteristic of the transmission system varies with the location of the decoding apparatus or differs with the transmitting sides, a predetermined specific information bit pattern is transmitted, as a training pattern, prior to the transmission of information, by which the receiving side produces reference waveforms based on the training pattern and stores them in a RAM or similar means. In this instance, the influence of noise or the like can be lessened by averaging a plurality of received waveforms of the same information bit "1" or "0".

Figure 8:
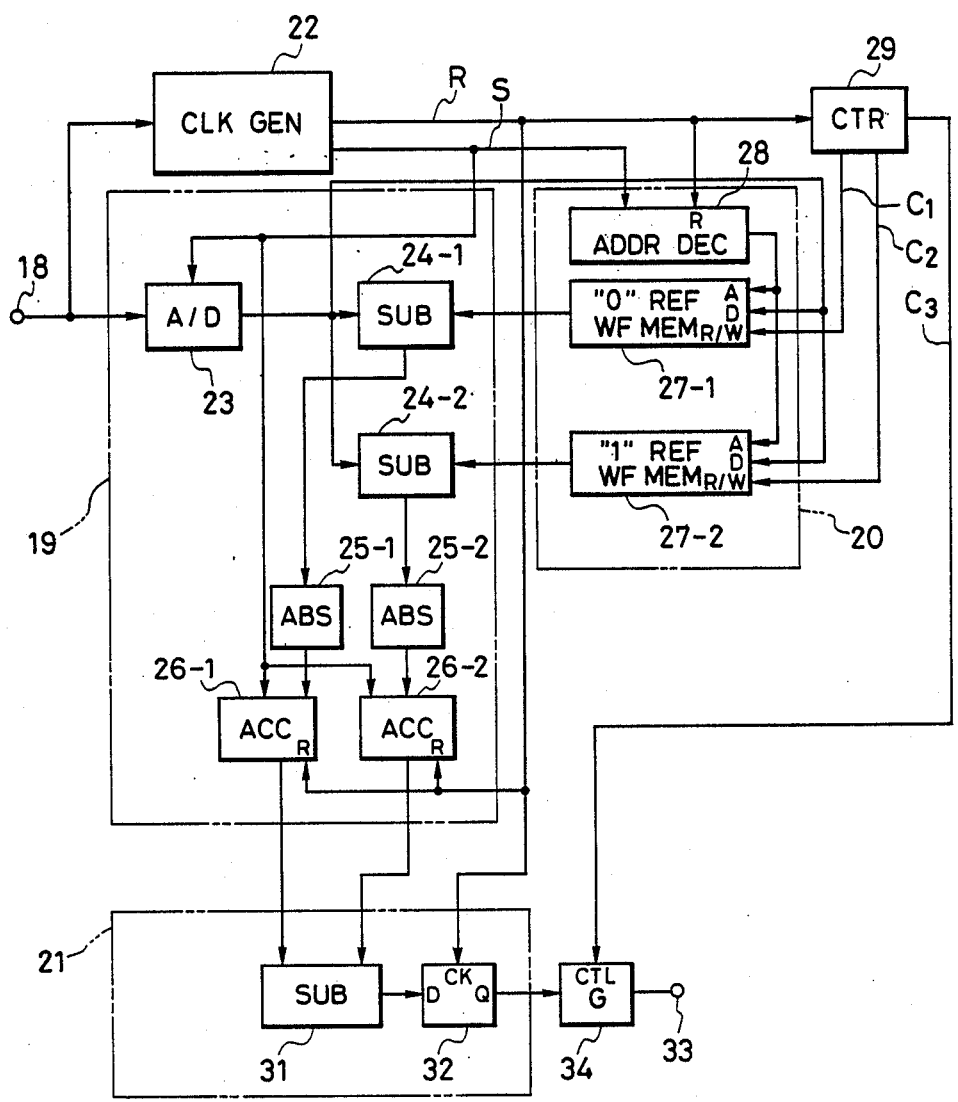
FIG. 8 is a block diagram illustrating a modified form of the decoding apparatus shown in FIG. 5, which is equipped with a reception training function.

Turning next to FIG. 8, the transmission of the above-mentioned training pattern will be described. This embodiment is identical in construction with that of FIG. 5 except for the additional provision of a counter 29 responsive to the reset signal R and a gate circuit 34 for inhibiting the output from the decoded information output section 21 during the training. The first and second reference waveform memories 27-1 and 27-2 are each formed by a RAM. The output of the A/D converter 23 is connected to data input terminals D of the "0" and "1" reference waveform memories 27-1 and 27-2 as well. When the power supply is in the ON state or when no input is applied to the input terminal 18 for a fixed period of time, the counter 29 is reset and provides a "0" at each of its outputs $C_1$ to $C_3$, disabling the gate 34.

Assume that the transmitting side transmits information appended at its head with training patterns "0" and "1". When the training pattern "0" is received first, the reset signal R is produced at the rise of the received waveform and the output $C_1$ from the counter 29 changes from "0" to "1". This output is connected to a read/write input of the "0" reference waveform memory 27-1, putting it in a mode of storing the output from the A/D converter 23. The "0" reference waveform memory 27-1 stores n waveform sample data of one bit of the received waveform corresponding to the information bit "0" at n addresses specified by the address decoder 28. Upon termination of the waveform of the training pattern "0", the reset signal R is yielded, by which the output $C_1$ of the counter 29 goes to "0" and instead the output $C_2$ rises from "0" to "1", putting the "1" reference waveform memory 27-2 in the mode of storing the outputs from the A/D converter 23 in succession. When the "1" reference waveform memory 27-2 has completed the storing of n waveform sample data of one bit at n addresses specified by the address decoder 28, the reset signal R is produced, by which the output $C_2$ of the counter 29 goes to "0", putting the "1" reference waveform memory 27-2 in read mode. At the same time, the output $C_3$ of the counter 29 rises to "1", enabling the gate 34. Thereafter the outputs $C_1$ to $C_3$ of the counter 29 remain unchanged and the information receiving operation takes place in the same manner as described previously with respect to FIG. 5.

Figure 9:
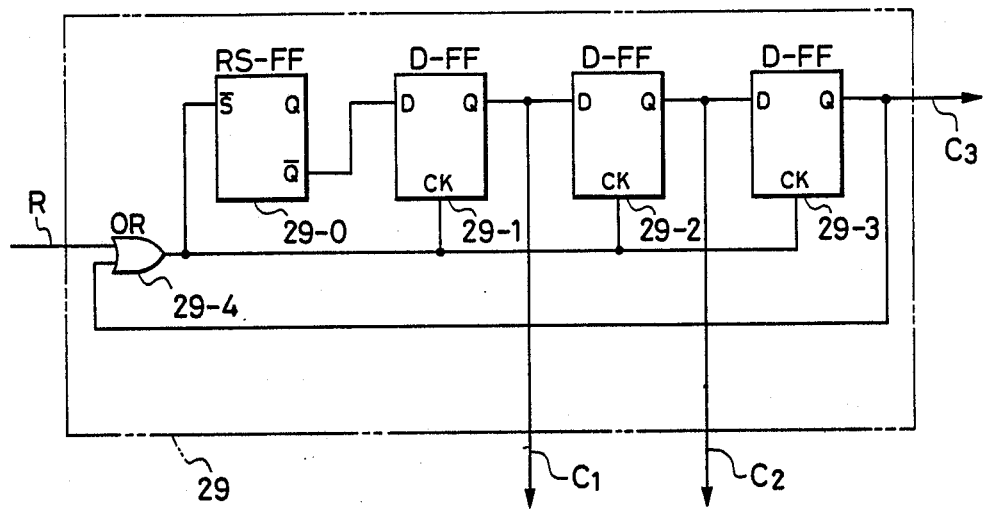
FIG. 9 is a circuit diagram showing an example of the arrangement of a counter 29 used in FIG. 8.

The counter 29, which operates as mentioned above, can be arranged as shown in, for example, FIG. 9, in which an RS flip-flop 29-0 and three D flip-flops 29-1 to 29-3 are connected in cascade and the Q output of the last-stage D flip-flop 29-3 and the reset signal R are applied via an OR gate 29-4 to the $\bar{S}$ input of the RS flip-flop 29-0 and the clock terminal CK of each of the D flip-flops 29-1 to 29-3. The Q outputs of the flip-flops 29-1 to 29-3 are used as the outputs $C_1$ to $C_3$ of the counter 29 for effecting read/write control of the "0" and "1" reference waveform memories 27-1 and 27-2 and for controlling the gate circuit 34, as referred to above. In the initial state the $\bar{Q}$ output of the RS flip-flop 29-0 is at "1" level and the Q outputs of the D flip-flops 29-1 to 29-3 are at "0" level. At the fall of the first reset signal R the initial state "1" of the $\bar{Q}$ output of the RS flip-flop 29-0 is read into the D flip-flop 29-1, by which its Q output goes to "1" and at the same time the $\bar{Q}$ output of the RS flip-flop 29-0 goes to "0". At the fall of the second reset signal R the Q outputs of the D flip-flops 29-1 and 29-2 go to "0" and "1", respectively, and at the fall of the third reset signal R the Q outputs of the D flip-flops 29-2 and 29-3 go to "0" and "1", respectively. Since the "1" at the Q output of the D flip-flop 29-3 is applied to the OR gate 29-4, the third and subsequent reset signals R are masked, holding the flip-flops 29-0 to 29-3 unchanged. In this way, the afore-mentioned operations of the counter 29 can be carried out.

In the embodiment depicted in FIG. 8 it is also possible to send each of the training patterns a plurality of times and average the received waveforms of each pattern.

The embodiment shown in FIG. 5 has been described in connection with the case where the information sent out from the transmitting side is binary information of "0" and "1" levels. Even if the information is multilevel, however, this can be dealt with simply by increasing the numbers of the reference waveform memories 27-1, 27-2, the subtractors 24-1, 24-2, the absolute value circuits 25-1, 25-2, and the accumulators 26-1, 26-2 correspondingly.

Figure 10:
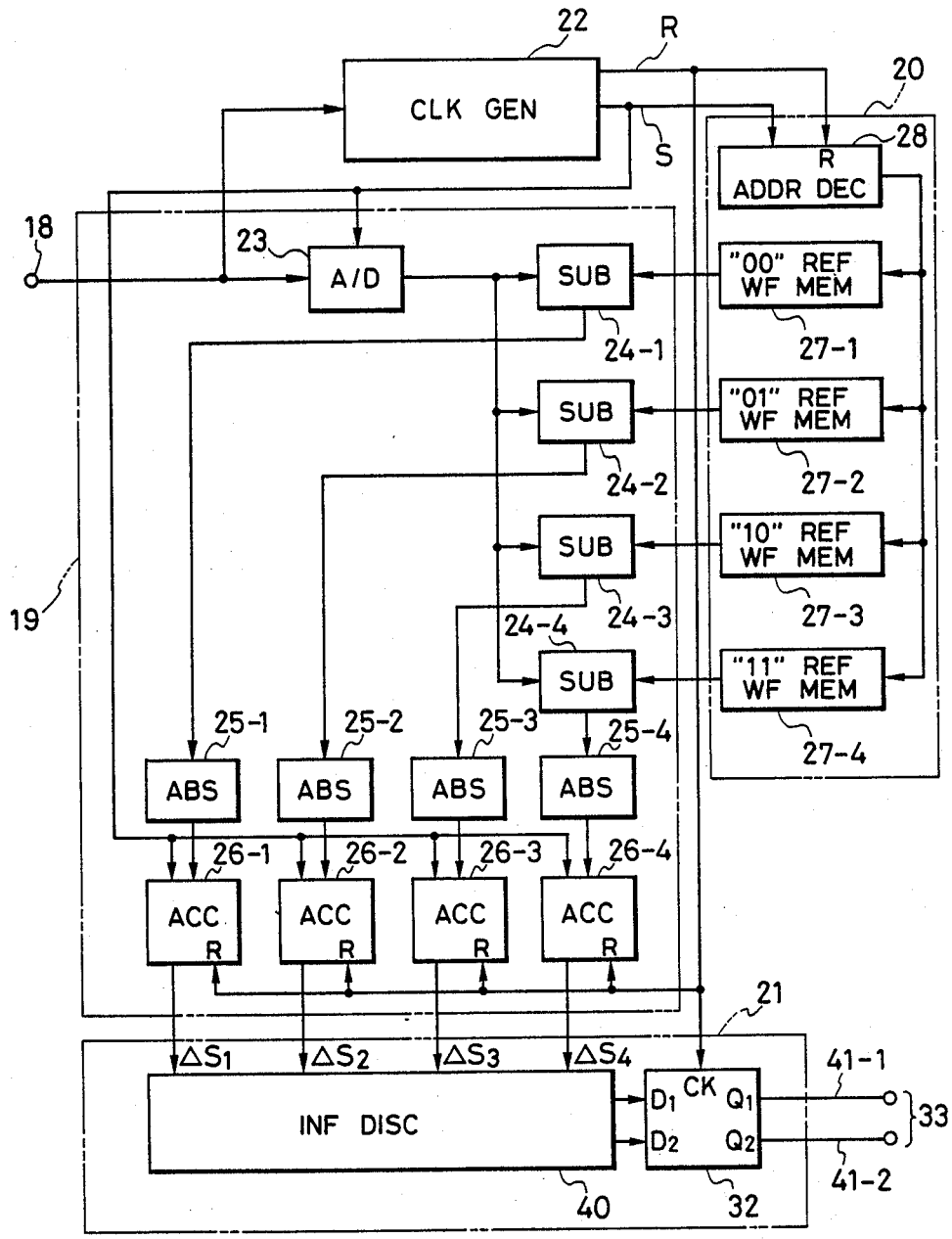
FIG. 10 is a block diagram illustrating another embodiment of the decoding apparatus of the present invention.

FIG. 10 shows an example of the present invention for handling a multilevel, or multi-value, code. Now, a description will be given of the case where quaternary information bits "00", "01", "10" and "11" are transmitted in such waveforms as shown in (a) to (d) of FIG. 11 and received in such waveforms as shown in (e) to (h) of FIG. 11.

In FIG. 10 the reference waveform storage section 20 is provided with first to fourth reference waveform memories 27-1 to 27-4, in which there have been pre-stored such reference waveforms as depicted in (i) to (1) of FIG. 11, corresponding to the quaternary information bits "00", "01", "10" and "11", respectively. Each reference waveform is represented by n sample data. As will be seen from comparison with the embodiment depicted in FIG. 5, the waveform comparing section 19 has subtractors 24-1 to 24-4, absolute value circuits 25-1 to 25-4 and accumulators 26-1 to 26-4 of the same number as that of the first to fourth reference waveform memories 27-1 to 27-4. The address decoder 28 generates an address which is incremented by one with the sampling signal S from the clock generating section 22, and the decoder 28 is reset by the reset signal R. The address yielded from the address decoder 28 is simultaneously provided to the first to fourth reference waveform memories 27-1 to 27-4, reading out therefrom the reference waveforms. An information discriminating section 40 compares outputs $\Delta S_1$ to $\Delta S_4$ from the four accumulators 26-1 to 26-4 and outputs digital information corresponding to the smallest one of them.

Figure 12:
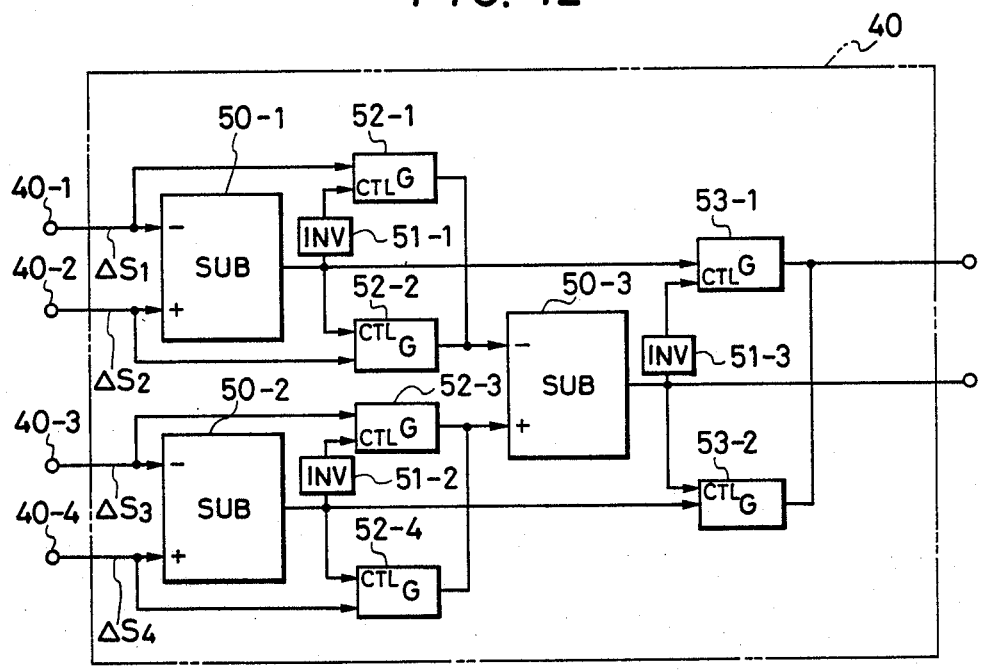
FIG. 12 is a block diagram showing an example of the arrangement of an information discriminating section used in FIG. 10.

The operation of the waveform comparing section 19 in this embodiment is the same as in the embodiment shown in FIG. 5, and hence will not be described in detail. The waveform comparing section 19 yields areal differences $\Delta S_1$ to $\Delta S_4$ between the received waveform and the respective four reference waveforms. The information discriminating section 40 of the decoded information output section 21 compares the four areal differences $\Delta S_1$ to $\Delta S_4$ and discriminates information corresponding to the smallest one of them. The basic arrangement of the information discriminating section 40 is a combination of a plurality of subtractors 31 in FIG. 5. FIG. 12 illustrates an operative example of the information discriminating section 40.

In FIG. 12 the outputs from the accumulators 26-1 to 26-4 are provided to input terminals 40-1 to 40-4 and these outputs are representative of the areal differences $\Delta S_1$ to $\Delta S_4$ between the received waveform and the respective reference waveforms of quaternary information bits "00", "01", "10" and "11". Basically the information discriminating section 40 compares the four areal differences $\Delta S_1$ to $\Delta S_4$ in two pairs and determines the smaller ones of them and then compares the two areal differences determined to be smaller, thereby determining the smallest areal difference. That is, the areal difference $\Delta S_1$ is subtracted from $\Delta S_2$ in a subtractor 50-1 and its borrow output is applied directly to a control input of a gate circuit 52-2. The same borrow output is provided via an inverter 51-1 to a control input of a gate circuit 52-1. In other words, the outputs $\Delta S_1$ and $\Delta S_2$ from the accumulators 26-1 and 26-2 are compared, and when the output $\Delta S_1$ is smaller than $\Delta S_2$, the borrow output goes to "0" and the gate circuit 52-1 is enabled, through which the output $\Delta S_1$ is output to a subtractor 50-3. Conversely, when the output $\Delta S_2$ is smaller than $\Delta S_1$, the borrow output goes to "1" and the gate circuit 52-2 is enabled, through which the output $\Delta S_2$ is output to a subtractor 50-3. Similarly, the outputs $\Delta S_3$ and $\Delta S_4$ from the accumulators 26-3 and 26-4 are compared in a subtractor 50-2, from which a smaller one of them is provided to the subtractor 50-3. Further, the smaller one of the data $\Delta S_1$ and $\Delta S_2$ and the smaller one of the data $\Delta S_3$ and $\Delta S_4$ are compared in the subtractor 50-3, which yields a borrow output "0" or "1", depending on whether $\Delta S_1$ or $\Delta S_2$ is smaller or larger than $\Delta S_3$ or $\Delta S_4$. This borrow output constitutes a high-order bit 41-2 of quaternary information to be reproduced. When the borrow output is "0", a gate circuit 53-1 is enabled, through which the borrow output resulting from the comparison of the data $\Delta S_1$ and $\Delta S_2$ is output as a low-order bit 41-1 of the quaternary information to be reproduced. Conversely, when the borrow output is "1", a gate 53-2 is enabled, through which the borrow output resulting from the comparison of the data $\Delta S_3$ and $\Delta S_4$ is output as the low-order bit 41-1 of the quaternary information to be reproduced.

Accordingly, for instance, when the data $\Delta S_1$ is the smallest, the high-order bit 41-2 of the output information, i.e. the output of the subtractor 50-3 goes to "0" and the low-order bit 41-1, i.e. the output of the subtractor 50-1 also goes to "0", then data "00" is latched in the flip-flop 32. Likewise, in the cases where one of the data $\Delta S_3$, $\Delta S_3$ and $\Delta S_4$ is the smallest, corresponding one of data "01", "10" and "11" is latched in the flip-flop 32. In this way, digital information is decoded corresponding to the smallest one of the outputs AS to $\Delta S_4$ of the four accumulators 26-1 to 26-4. As in the case of the embodiment shown in FIG. 5, the decoded information is latched, by the reset R, in the D flip-flop 32 and used as the decoded output of the received waveform. In this embodiment the output is provided in a two-bit parallel form, but it may also be provided in a one-bit serial form through use of a shift register or the like. Incidentally, each of the gate circuits 52-1 to 52-4 and 53-1 to 53-2 in FIG. 12 is of the type that holds its output impedance high, inhibiting the passage therethrough of the input signal when its control input is "0". Conversely, each of the gate circuits 52-1 to 52-4 permits the passage therethrough of the input signal when the control input is "1". This gate circuit is commercially available under the name of tri-state logic.

As described above, according to the embodiment depicted in FIG. 10, a quaternary information decoding apparatus which is highly economical and capable of high-speed processing can also be implemented as in the case of the binary information decoding apparatus. It will be evident that decoding apparatus for desired information other than quaternary information can also be implemented by increasing the numbers of the reference waveform memories 27, the subtractors 24, the absolute value circuits 25 and accumulators 26 and extending the information discriminating section 40 as required. Needless to say, various modifications can be effected for the waveform comparing section 19, the reference waveform storage section 20, and so forth, as described previously in respect of the binary information decoding apparatus. Moreover, the decoding apparatus can be arranged so that received waveforms of training patterns sent at the head of transmitted information are stored as the reference waveforms in the reference waveform storage section 20 in the same manner as in the embodiment shown in FIG. 8.

The present invention has been described as being applied to binary and multilevel information decoding apparatus in connection with the case where transmitted waveforms are used which represent transmitted information bits by Manchester codes. The decoding apparatus of the present invention prestores, as reference waveforms, received waveforms corresponding to particular information and compares a received waveform with the reference waveforms for decoding. Accordingly, as long as the same transmitted information is received in substantially the same waveform at all times, the present invention can be employed in any decoding apparatus regardless of the coding scheme used. For example, the decoding apparatus according to the invention can be applied not only to AMI, CMI and Manchester codes but also FS and AM codes.

In the above it is assumed that the same transmitted information bit is received in the same waveform at all times, but there are cases where the same transmitted information bit (the same transmitted waveform) is received in different waveforms according to the characteristic of the transmission system. For instance, in the case where the transmission line has bridge taps each of which causes reflection of a transmitted signal, double reflection components of a transmitted bit waveform, which are delayed relative to the non-reflected component, are superimposed on non-reflected components of succeeding bit waveforms, thus causing waveform distortion. That is, even if the same information bit is transmitted, the received bit waveform differs when the preceding transmitted information bits differ.

Figures 13A, 13B, 13C:
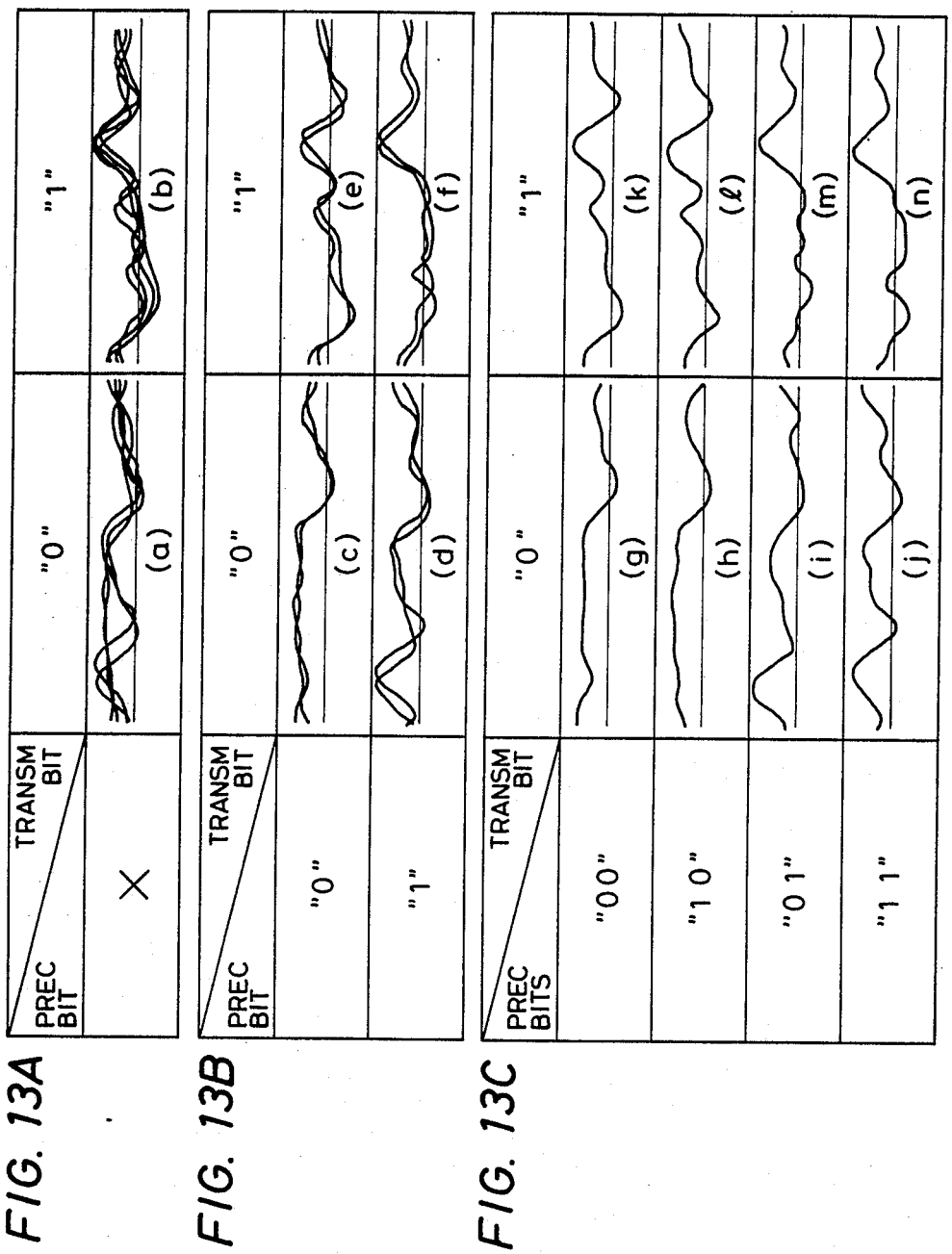
FIGS. 13A through 13C are waveform diagrams, for explaining how the received waveform of a given information bit is affected by the preceding bits.
Figure 14:
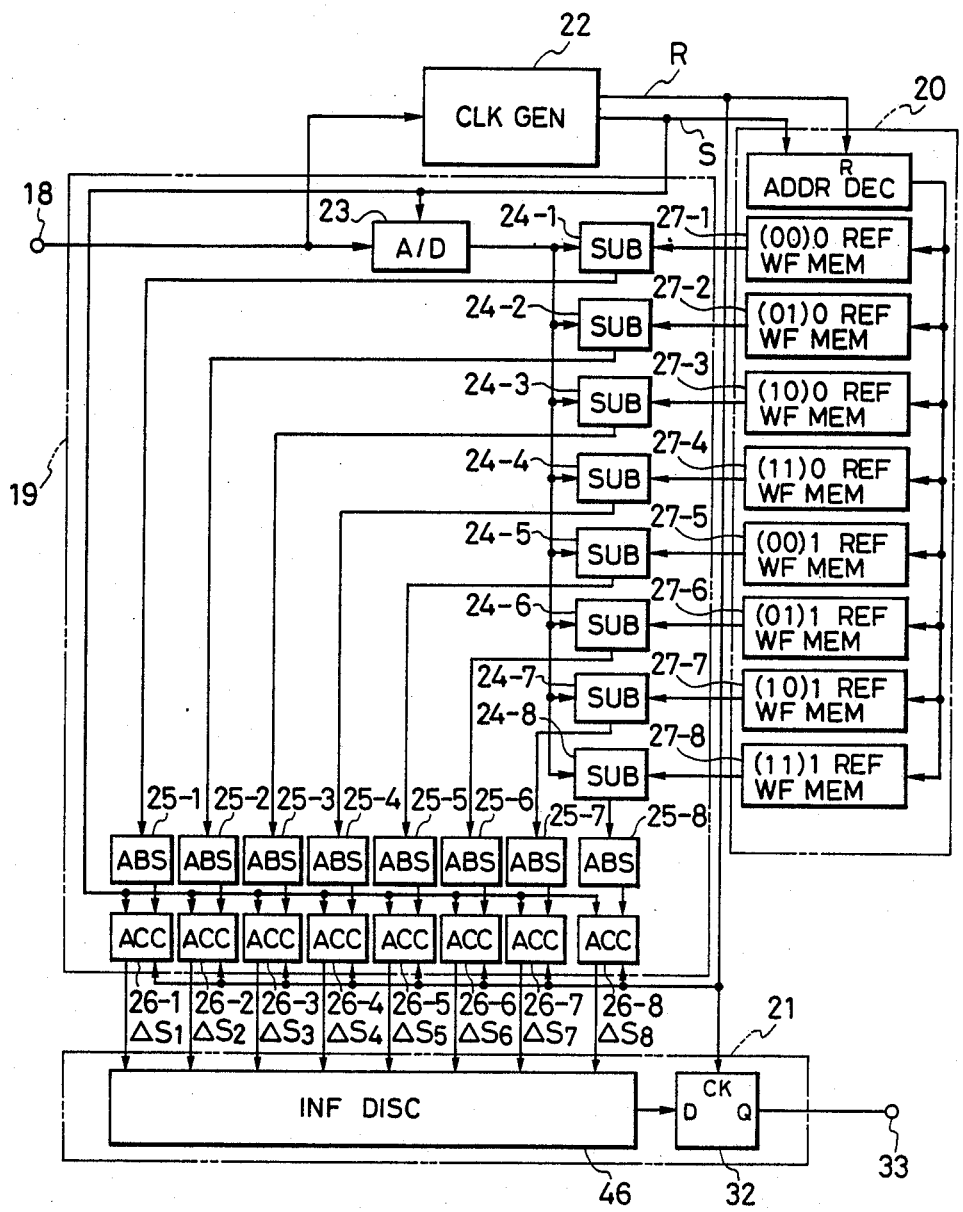
FIG. 14 is a block diagram illustrating another embodiment of the decoding apparatus of the present invention.

FIG. 13A(a) shows a superposition of four typical received waveforms of the transmitted information bit "0" and FIG. 13A(b) a superposition of four typical received waveforms of the transmitted information bit "1". As shown, the received waveforms of even the same transmitted information bits "1" and "0" may sometimes differ under the influence of the reflection components of the previous transmitted bits. Accordingly, in the case where desired ones of the received waveforms shown in FIGS. 13A(a) and (b) are prestored, as reference waveforms of the information bits "0" and "1", in the reference waveform memories 27-1 and 27-2 of th-e embodiment depicted in FIG. 5, for instance, there is the possibility that the comparative relationship of the areal differences between the received waveform of a certain transmitted bit and the two reference waveforms would be reversed from the true comparative relationship of areal differences. This results in a decoding error. If various kinds of reference waveforms affected by the different preceding bits are prepared for information bits "0" and "1", such decoding errors can be reduced. In general, the immediately preceding bit is most influential and bits previous thereto are less influential; therefore, when classified depending on whether the preceding bit is "0" or "1", received waveforms are converged to some extent, as shown in FIGS. 13B(c), (d), (e) and (f). When classified according to the two preceding bits, the waveforms are further converged, as shown in FIGS. 13C(g) to (n). In this way, the received waveforms are converged by classifying them using several preceding bits, an by prestoring, as reference waveforms, a plurality of such converged waveforms for each of information bits "0" and "1", it is possible to obtain a decoding apparatus which does not seriously suffer decoding errors. FIG. 14 illustrates an embodiment of such a decoding apparatus.

Figure 15:
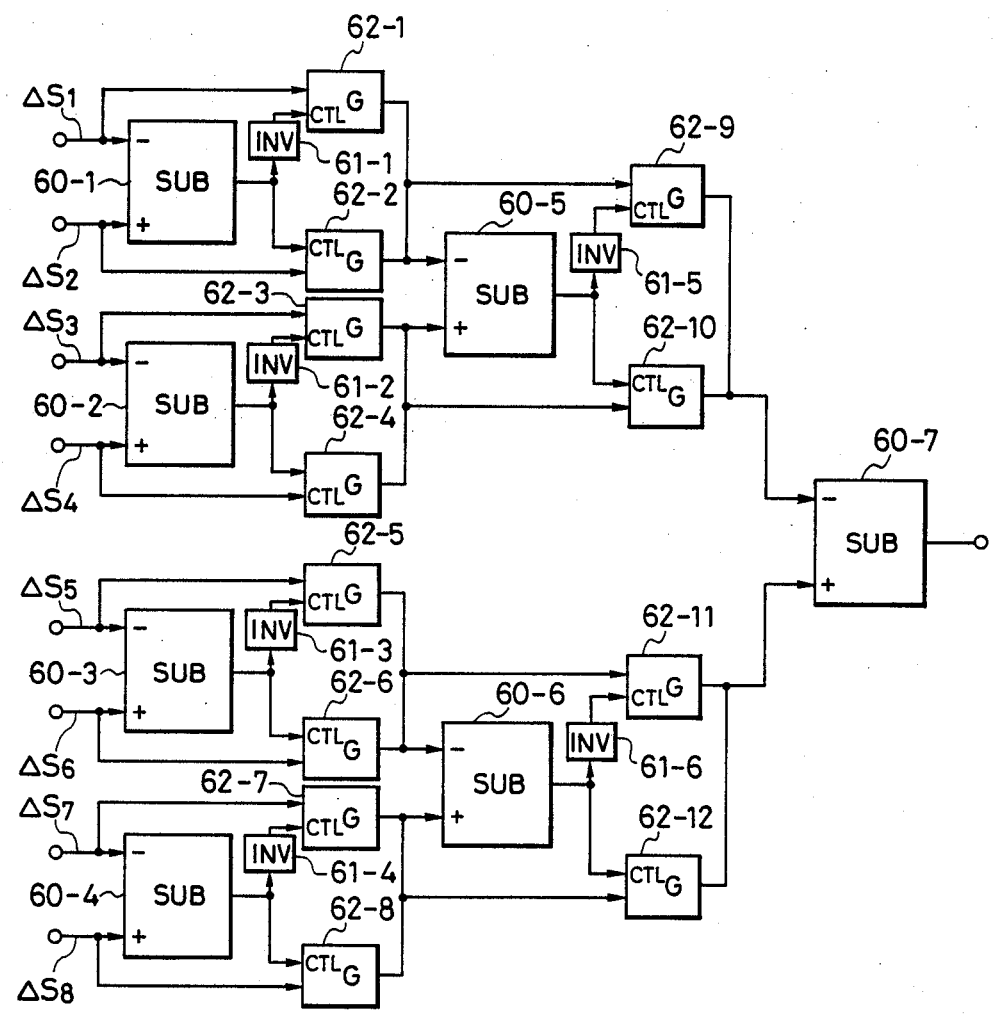
FIG. 15 is a block diagram showing an example of the arrangement of an information discriminating section 46 utilized in the embodiment depicted in FIG. 14.

In the embodiment shown in FIG. 14 there are prestored reference waveforms obtained by classifying the received waveforms of transmitted binary code "0" and "1" according to two bits immediately preceding them. That is, this embodiment utilizes a total of eight reference waveforms for transmitted bits which are preceded immediately by bits "00", "01", "10" and "11", as shown in FIGS. 13C(g) to (n). These reference waveforms are prestored in reference waveform memories 27-1 to 27-8, respectively. Corresponding to the number of reference waveform memories used there are provided, in the waveform comparing section 19, eight subtractors 24-1 to 24-8, eight absolute value circuits 25-1 to 25-8 and accumulators 26-1 to 26-8, and they are interconnected in the same manner as in the waveform comparing section 19 shown in FIG. 5 or 10. The waveform comparing section 19 is identical in operation with that depicted in FIG. 5 or 10; namely, it yields areal differences $\Delta S_1$ to $\Delta S_8$ between the received waveform and the eight reference waveforms. Accordingly, no detailed description will be given of the operation. An information discriminating section 46 of the decoded information output section 21 detects the smallest one of the eight areal differences $\Delta S_1$ to $\Delta S_8$ provided from the waveform comparing section 19. FIG. 15 shows an example of the arrangement of the information discriminating section 46.

As will be seen from FIG. 15, the information discriminating section 46 basically comprises subtractors 60-1 to 60-7, inverters 61-1 to 61-6 and tri-state logic gate circuits 62-1 to 62-12 as is the case with the information discriminating section 40 depicted in FIG. 12. An upper half circuit which includes the subtractors 60-1, 60-2 and 60-5 and provides one of inputs to the subtractor 60-7, and a lower half circuit which includes the subtractors 60-3, 60-4 and 60-6 and provides the other input to the subtractor 60-7 are both identical with the circuit shown in FIG. 12 in operation as well as in construction.

A description will be given first of the outputs $\Delta S_1$ to $\Delta S_4$ of the accumulators 26-1 to 26-4 which are the differences in area between the four "0" reference waveforms and the received waveform. The outputs $\Delta S_1$ and $\Delta S_2$ of the accumulators 26-1 and 26-2 are compared by the subtractor 60-1 in terms of magnitude and the gate corresponding to the smaller output is enabled, through which it is applied to the subtractor 60-5 of the next stage. Similarly, the outputs $\Delta S_3$ and $\Delta S_4$ of the accumulators 26-3 and 26-4 are compared by the subtractor 60-2 and the gate corresponding to the smaller output is enabled, through which it is provided to the subtractor 60-5. These two smaller outputs are further compared by the subtractor 60-5 and the gate corresponding to the smaller one of them is enabled, through which it is applied to the subtractor 60-7. Thus the smallest one of the areal differences $\Delta S_1$ to $\Delta S_4$ between the received waveform and the four "0" reference waveforms is provided to the subtractor 60-7. In a similar fashion, the smallest one of the areal differences $\Delta S_5$ to $\Delta S_8$ between the received waveform and the four "1" reference waveforms is output to the subtractor 60-7. The subtractor 60-7 compares both inputs and outputs "1" or "0", depending on whether the former is larger or smaller than the latter. This output is latched, by the reset signal R, in the D flip-flop 32 shown in FIG. 14, from which it is provided as decoded information at the output terminal 33.

As described above, even if the same transmitted information is received in four kinds of different waveforms, it can be decoded. No matter how many kinds of received waveforms one transmitted code may be classified into, it can be decoded by providing reference waveform memories, subtractors, absolute value circuits and accumulators each of the same number as the received waveforms into which the transmitted code is classified into. It is a matter of course that this decoding apparatus is applicable to the decoding of such multilevel transmitted information as described previously in connection with FIG. 10.

Figure 16:
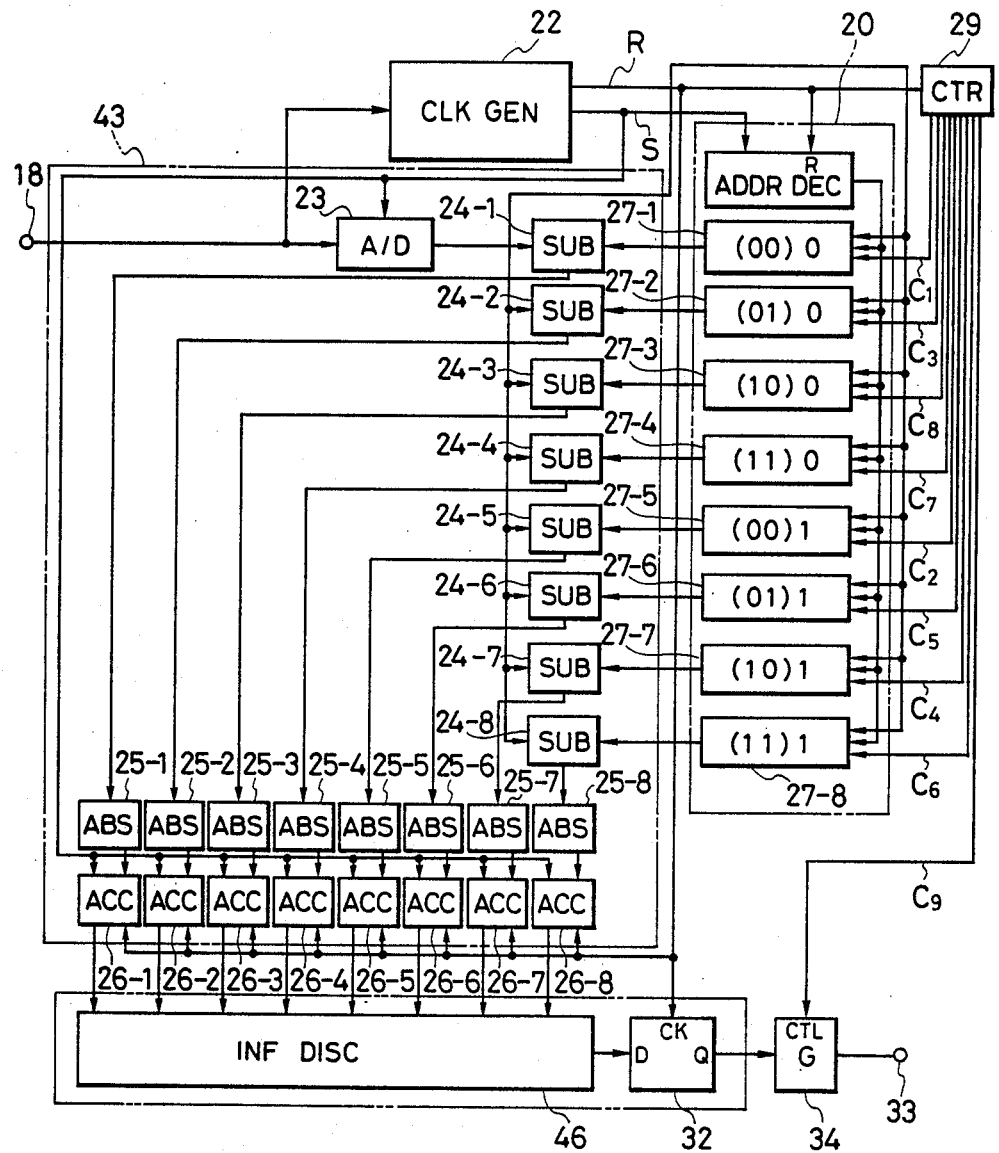
FIG. 16 is a block diagram showing a modification of the decoding apparatus depicted in FIG. 14, which is additionally equipped with a reception training function.

FIG. 16 illustrates in block form a modification of the decoding apparatus shown in FIG. 14, which is additionally equipped with a function of deriving reference waveforms from a received training pattern and writing them into the reference waveform memories. Therefore, this decoding apparatus has a construction corresponding to that of the embodiment shown in FIG. 8 which has a similar training function.

In FIG. 16, the decoding system shown in FIG. 14 has added thereto a counter 29 for specifying, in succession, the reference waveform memories 27-1 to 27-8 in which are stored reference waveforms contained in the training pattern obtained at the output of the A/D converter 23, and a gate 34 for inhibiting the output of the decoding apparatus during the training period, i.e. during the writing of the reference waveforms into the memories 27-1 to 27-8. The operation for decoding the transmitted information from the received waveform after the training is exactly the same as in the case of the embodiment shown in FIG. 14; therefore, no description will be repeated in this connection. Now, the training operation will be described. The counter 29 is reset when the power supply is turned ON or when no input is applied to the input terminal 18 for a certain period of time. In the reset state the outputs $C_1$ to $C_9$ of the counter 29 are at "0" level. Upon initiation of the reception of transmitted information appended at its head with the training pattern, tee clock generating section 22 yields the reset signals R synchronized with the bit rate of the transmitted information, starting at the rise of the received waveform, and provides the reset signals R to the counter 29. The counter 29 does not respond to first and second reset signals R, but upon each reception of third and subsequent reset signals R, one of the outputs $C_1$ to $C_8$ goes to "1" in this order. When the reset signal R is applied to the counter 29 after the output $C_8$ has gone to "1", this output goes to "0" and the output $C_9$ goes to "1". After this, the outputs $C_1$ to $C_8$ remain at "0" and the output $C_9$ at "1".

When a training pattern, for example 0001011100, is transmitted from a transmitting side and its distorted waveform is received, the outputs $C_1$ to $C_9$ are all at "0" level for the first two bits, and accordingly the reference waveform memories 27-1 to 27-8 are in the read mode and no waveform is written therein. At the rise of the next bit "0" the output $C_1$ goes to "1", putting the memory 27-1 in the write mode. Consequently waveform sample data from the A/D converter 23 is stored in the memory 27-1. Thereafter the outputs $C_2$ to $C_8$ go to "1" one after another upon each application of the reset signal to the counter 29, and the reference waveform memories specified by them enter the write mode in succession, storing therein received waveforms corresponding to the respective remaining bits 1011100.

Upon completion of storing all of the eight waveforms in the waveform memories, the outputs $C_1$ to $C_8$ go to "0", putting all the memories 27-1 to 27-8 in the read mode. At the same time, the output $C_9$ goes to "1", enabling the gate 34. This is followed by the decoding operation as described previously in respect of the embodiment depicted in FIG. 14. It is also easy to transmit the training pattern a plurality of times for averaging it.

As described above, reference waveforms are created which respectively correspond to the eight bits 01011100 of the 10-bit training pattern, except the first two bits. In this case, these eight bits are four "0s" and four "1s" and the training pattern is produced so that these "0s" and "1s" are preceded by four kinds of bit patterns "00", "01", "10" and "11", respectively. By this, the eight reference waveforms (g) to (n) shown in FIG. 13C are obtained. Such a training pattern may also utilize other bit arrangements. In general, when each information bit to be transmitted is expressed in an m-value code, the shortest training pattern length L necessary in the case where p bits affect the next bit is expressed by $L = m \times m^p + p$, where $m \times m^p$ is the number of waveforms to be stored, and p is the number of preceding bits necessary for creating the waveforms to be stored first. For example, where each information bit is expressed in a binary code, the training pattern length is given by $L = 2 \times 2^p + p$. Similarly, if quaternary codes are used, the length is given by $L = 4 \times 4^p + p$.

Figure 16A:
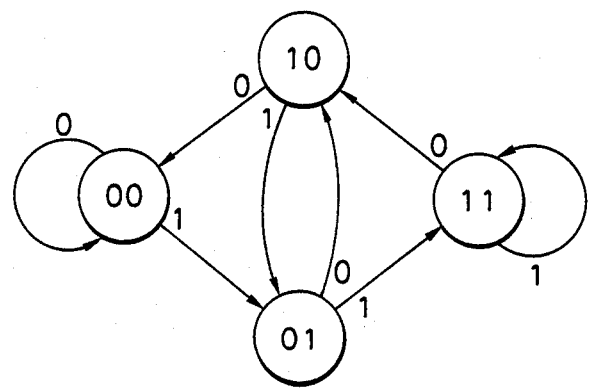
FIGS. 16A and 16B are state transition diagrams for creating a training pattern.
Figure 16B:
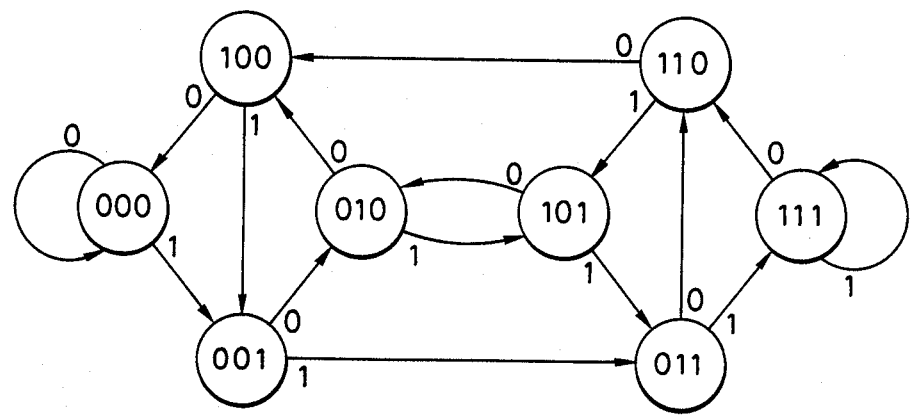

A description will be given, with reference to FIG. 16A, of a method for producing the training pattern when the information to be transmitted is binary (m=2). FIG. 16A shows the case where p=2, and circles each indicate the state in which two successive bits expressed by the numerals therein have been received most recently. The arrows each indicate the state transition in the case where a bit of the value written beside the arrow is received next. It is seen that, for example, when receiving "1", the state "00" will transit to the state "01". In this instance, since the information to be transmitted is binary information (m=2), each bit is "0" or "1". Accordingly, in the case of receiving the next bit in each state, there are two possible state transitions towards other states which may take place, and the number of possible state transitions to reach each state is also two. The creation of the shortest training pattern needs only to determine a path which starts from a desired state, passes along all the arrows joining these states and returns to the first state. For instance, in the case of selecting a path which starts with the state "00" and passes through the states "00", "01", "11", "11", "10", "01", "10" and "00" one after another, a bit pattern 01110100 is obtained by sequentially arranging the bits which specify the selected state transition paths, respectively. By adding the first state "00" to the beginning of the bit pattern, a training pattern "0001110100" can be obtained. FIG. 16B is a state transition diagram in the case where p=3, that is, where three preceding bits affect the next. Also in this case, a 19-bit training pattern can similarly be produced. For instance, a pattern "0000111101100101000" can be obtained, starting with the state "000".

Figure 17:
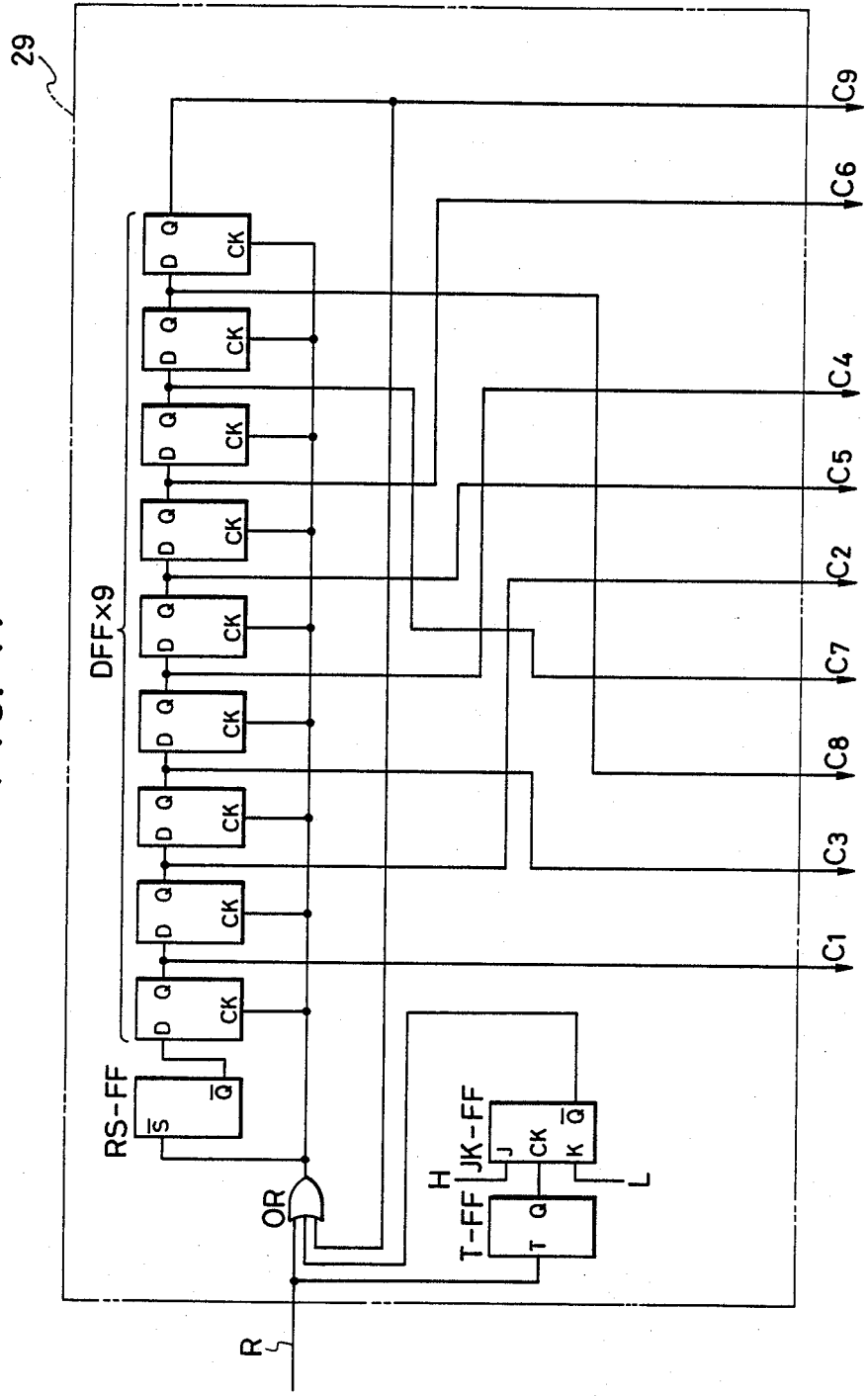
FIG. 17 is, a circuit diagram showing an example of the arrangement of a counter 29 used in FIG. 16.

FIG. 17 illustrates an example of the arrangement of the counter 29 used in the embodiment shown in FIG. 16. The counter 29 includes a shift register composed of an RS flip-flop for initialization and nine stages of D flip-flops connected thereto and a pair of T flip-flop and a JK flip-flop which inhibit the shift operation of the shift register in response to the first two reset signals R.

In the initial state the $\overline{Q}$ output of the RS flip-flop is "1", the Q output of the T flip-flop is "0", and the $\overline{Q}$ output of the JK flip-flop is "1". Upon application of the first reset signal R, the Q output of the T flip-flop goes to "1" but the $\overline{Q}$ output of the JK flip-flop remains at "1"; and so that the RS flip-flop remains in its initial state and the shift register does not perform the shift operation. Upon application of the second reset signal R, the Q output of the T flip-flop goes to "0" again, and at its fall, the JK flip-flop is set and its $\overline{Q}$ output goes to "0". The JK flip-flop is held in its set state ($\overline{Q}$="0"). Consequently, upon each application of the third and subsequent reset signals R, the output "1" of the RS flip-flop is shifted through the D flip-flops one after another, and thereafter the counter 29 operates in the same manner as that shown in FIG. 9.

Figure 18:
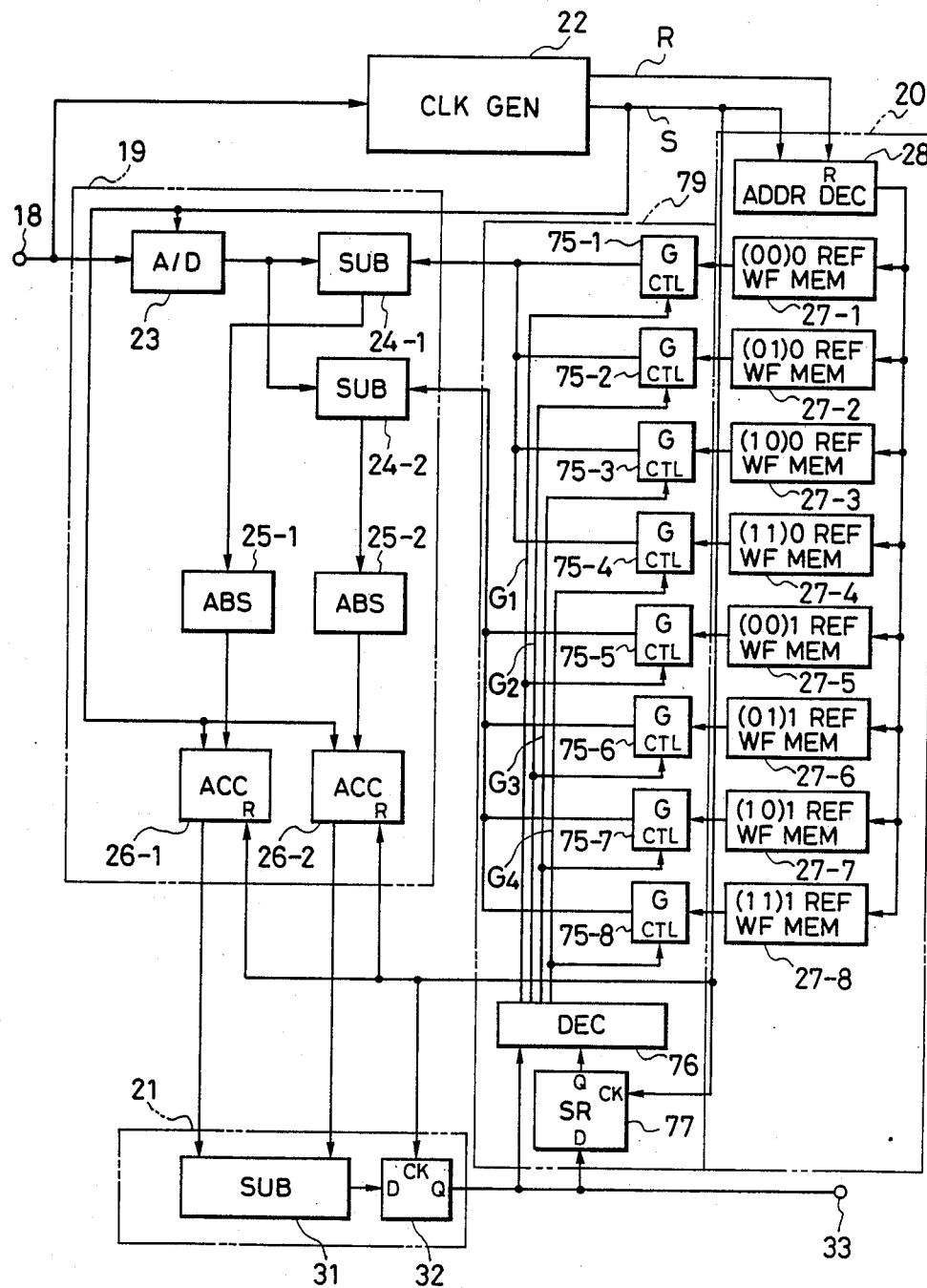
FIG. 18 is a block diagram illustrating another embodiment of the decoding apparatus of the present invention.

FIG. 18 illustrates in block form another embodiment of the decoding apparatus of the present invention. This embodiment will be described in connection with the case of performing the decoding operation through use of four reference waveforms for each of binary information bits "0" and "1", that is, the eight reference waveforms shown in FIGS. 13C(g) to (n).

The decoding apparatus of this embodiment is identical in construction with that shown in FIG. 5 except for the substitution of the reference waveform storage section 20 with that shown in FIG. 14 and the provision of a waveform selecting section 79. However, this embodiment does not compare the received waveform with all of the eight reference waveforms as is done in the embodiment depicted in FIG. 14. In this embodiment, two reference waveforms, which are to be compared with the received waveform influenced by the immediately preceding two bits, are selected based on the two bits from the eight reference waveforms shown in FIG. 13C, and the two selected reference waveforms are compared with the received waveform in the same manner as in the embodiment of FIG. 5. That is, since the two bits decoded immediately before are preknown, this decoding apparatus relies on the presumption that it is predictable which pair of the eight reference waveforms (i.e. reference waveforms for "0" and "1") must include the reference waveform that resembles most to the currently received waveform affected by the preceding bits.

In the reference waveform storage section 20 the reference waveform memories 27-1 to 27-4 have stored therein reference waveforms of "0s" which are preceded by bits "00", "01", "10" and "11", respectively, and the reference waveform memories 27-5 to 27-8 have similarly prestored therein reference waveforms of "1s". The decoded information output section 21 compares two outputs of the waveform comparing section 19 and outputs binary information "0" or "1" corresponding to the smaller one of them.

The waveform selecting section 79 selects one of the reference waveforms of each of the bits "0" and "1" by use of the two decoded preceding digital information bits. The waveform selecting section 79 is made up of gate circuits 75-1 to 75-8, each of which becomes high-impedance at its output or passes therethrough the input signal, depending on whether the control input is "0" or "1", a decoder 76 which produces "1" at only one of four outputs $G_1$ to $G_4$ selected by two-bit input, and a D flip-flop 77 which constitutes a one-bit shift register for storing decoded information.

Upon each input thereto of the reset signal R, the D flip-flop 77 reads thereinto an output information bit from the flip-flop 32 of the decoded information output section 21. Accordingly, the flip-flop 77 stores an information bit immediately preceding the information bit which the decoded information output section 21 (or more specifically, the flip-flop 32) is currently outputting, and the two outputs of the flip-flops 32 and 77 are provided to the decoder 76. Thus the decoder 76 is always supplied with information of two successive bits decoded immediately prior to the bit which is currently desired to be decoded. When the values of the two bits are 00, 01, 10 and 11, the decoder 76 yields "1" at only one of the outputs $G_1$ to $G_4$ corresponding to the values, respectively. This output "1" is applied to the control inputs of two corresponding ones of the gate circuits 75-1 to 75-8, thus enabling one of the gate circuits 75-1 to 75-4 and one of the gate circuits 75-5 to 75-8. In this way, the waveform selecting section 79 reads out from the eight reference waveform memories 27-1 to 27-8 of the waveform storage section 20, two reference waveforms to be compared with the received one, based on the information of the two immediately preceding bits. The two reference waveforms thus selected are provided to the waveform comparing section 19. For example, when the two preceding bits are "00", the decoder 76 yields "1" at the output $G_1$ alone, enabling the gates 75-1 and 75-5. As a result of this, the reference waveform memory 27-1 (which has prestored therein the reference waveform of the bit "0" in the case where the preceding information is "00") and the reference waveform memory 27-5 (which has prestored therein the reference waveform of the bit "1" in the case where the preceding information is "00")are selected. The other operations are the same as those in the embodiment of FIG. 5.

Figure 19:
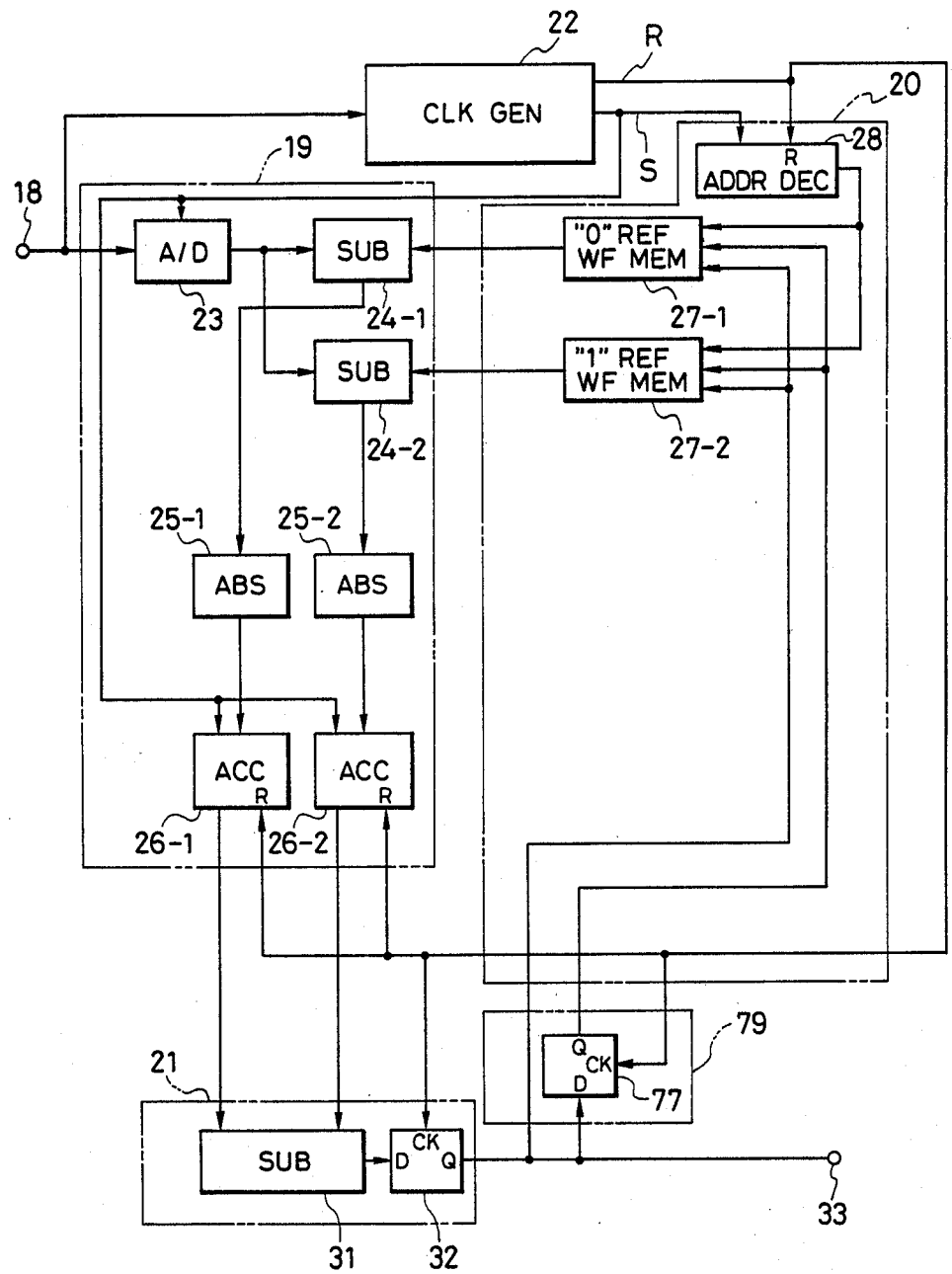
FIG. 19 is a block diagram illustrating a simplified form of the embodiment depicted in FIG. 18.

FIG. 19 illustrates another embodiment of the decoding apparatus of the present invention in which the waveform selecting section 79 and the reference waveform storage section 20 in FIG. 18 are modified. The reference waveform storage section 20 has a "0" reference waveform memory 27-1 and a "1" reference waveform memory 27-2, in each of which there-are prestored four reference waveforms in the cases where the two preceding bits are 00, 01, 10 and 11; namely, the reference waveforms (g) to (j) and (k) to (n) shown in FIG. 13C are prestored in the two memories, respectively. The waveform selecting section 79 is formed by the D flip-flop 77 alone. The outputs of the two flip-flops 32 and 77 are provided, as a two-bit reference waveform select address, to the reference waveform memories 27-1 and 27-2. On this account, the gate circuits 75-1 to 75-8 in FIG. 18 are unnecessary and the reference waveform storage section 20 comprises only two memories for storing the "0" and "1" reference waveforms, respectively. Thus the decoding apparatus of this embodiment is a very simple circuit arrangement.

In the embodiments described above with regard to FIGS. 18 and 19, since the received waveform is compared with specified reference waveforms, the difference between two areal differences obtained for the received waveform with respect to the "0" and "1" reference waveforms can be made large, providing for increased accuracy in the comparison of the waveforms. The decoding systems shown in FIGS. 18 and 19 can be used with a transmission system whose SN ratio is poor, as compared with the embodiment depicted in FIG. 14.

In the case of decoding each transmitted bit taking into account the influence of the three preceding bits in the embodiments of FIGS. 18 and 19, the reference waveform storage section 20 is adapted to store eight reference waveforms for each of the information bits "0" and "1" and the shift register 77 of the waveform selecting section 79 is formed as a two-bit shift register so that the reference waveforms are selectively read out of the waveform memories with a total of three output bits from the two-bit shift register and the flip-flop 32. It is apparent that the embodiments of FIGS. 18 and 19 can be modified so that reference waveforms are derived from the training pattern sent at the beginning of transmitted information and stored in the reference waveform storage section 20 as is the case with the embodiment of FIG. 16.

In the embodiments shown in FIGS. 18 and 19 the decoding operation can be performed when decoded information of the two preceding bits has already been latched in the flip-flops 32 and 77, that is, when a series of transmitted information is being received. It is considered, however, that there is a case where the received information bit cannot be decoded because of absence of the preceding information such as a case when the decoding apparatus initiates decoding of a received signal. A description will be given of methods of initiating the reception.

In the case of sending a specific training pattern prior to the transmission of information, the last several bits of the training pattern need only to be set as the preceding information. For instance, the embodiment of FIG. 18 is capable of starting the reception immediately after setting the last two bits of the training pattern in the D flip-flop 32 and the shift register (the D flip-flop) 77.

One method that can be used when no training pattern is sent is to predetermine the information that is transmitted first. That is, a specific bit string is appended to the beginning of the information to be transmitted. The decoding apparatus presets the information of this bit string in the D flip-flop 32 of the decoded information output section 21 and the shift register 77 of the waveform selecting section 79 and starts the comparison of the received waveform, beginning at the bit immediately following the bit string. For example, where the information to be transmitted is headed by "00" in the embodiment of FIG. 18, the clock generating section 22 yields a clear signal (not shown) at the time point of detecting the rise of the received waveform, by which the D flip-flop 32 and the shift register 77 are cleared, making the input to the decoder 76 "00". Thus the preceding information "00" is set. Furthermore, in order to wait for the completion of the transmission of the bit string "00" appended to the beginning of the information to be transmitted, the clock generating section 22 stops the outputting of the sampling signal S and the reset signal R for the period of time corresponding to these two bits. In this way, the decoding system is capable of selecting a suitable reference waveform at the start of transmission and initiating the reception.

Another method that can be utilized when no training pattern is sent first is to prestore specific reference waveforms which are used at the start of transmission. That is, reference waveforms for an information bit preceded by no information and reference waveforms for an information bit preceded by one-bit information are also prestored in the reference waveform storage section 20. For instance, in the embodiment of FIG. 18 the reference waveform storage section 22 is newly added with reference waveform memories which prestore a total of six reference waveforms, i.e. two reference waveforms for information bits "0" and "1" which are not preceded by any information and four reference waveforms for information bits "0" and "1" which are each preceded by only one bit "0" or "1". Moreover, six more gate circuits are also added to the waveform selecting section 79 and the decoder 76 and the shift register 77 are also extended accordingly. When comparing the first one bit at the start of reception by suitably setting the initial values of the flip-flop 32 and the shift register 77, the reference waveforms for the information bits "0" and "1" unpreceeded by information are provided to the waveform comparing section 19. For the next one bit, the reference waveforms for the information bits "0" and "1" each preceded by only one bit "0" or "1" are selected on the basis of the one-bit information received first and are provided to the waveform selecting section 19. Thereafter the decoding apparatus operates in the same manner as described previously in respect of FIG. 18.

The above has described the case where the preceding information is used for selecting the reference waveforms to be compared next. Also in this instance, for example, the function of the waveform selecting section 79 can be implemented by software and the waveform comparing section can be formed analogwise; namely, various arrangements can be utilized for implementing the decoding apparatus.

The embodiments depicted in FIGS. 5, 7, 8, 10, 14, 16, 18 and 19 have been described on the assumption that the clock generating section 22 regenerates a clock synchronized with the received signal, by use of conventional simple PLL and LC circuits. However, since the pulling-in of synchronization through use of the PLL usually consumes time of at least several bits, it is necessary that a preamble of a predetermined number of bits, for establishing synchronization, be added to the beginning of the information to be transmitted. This impairs the information transmitting efficiency, and hence is not preferable.

Figure 20:
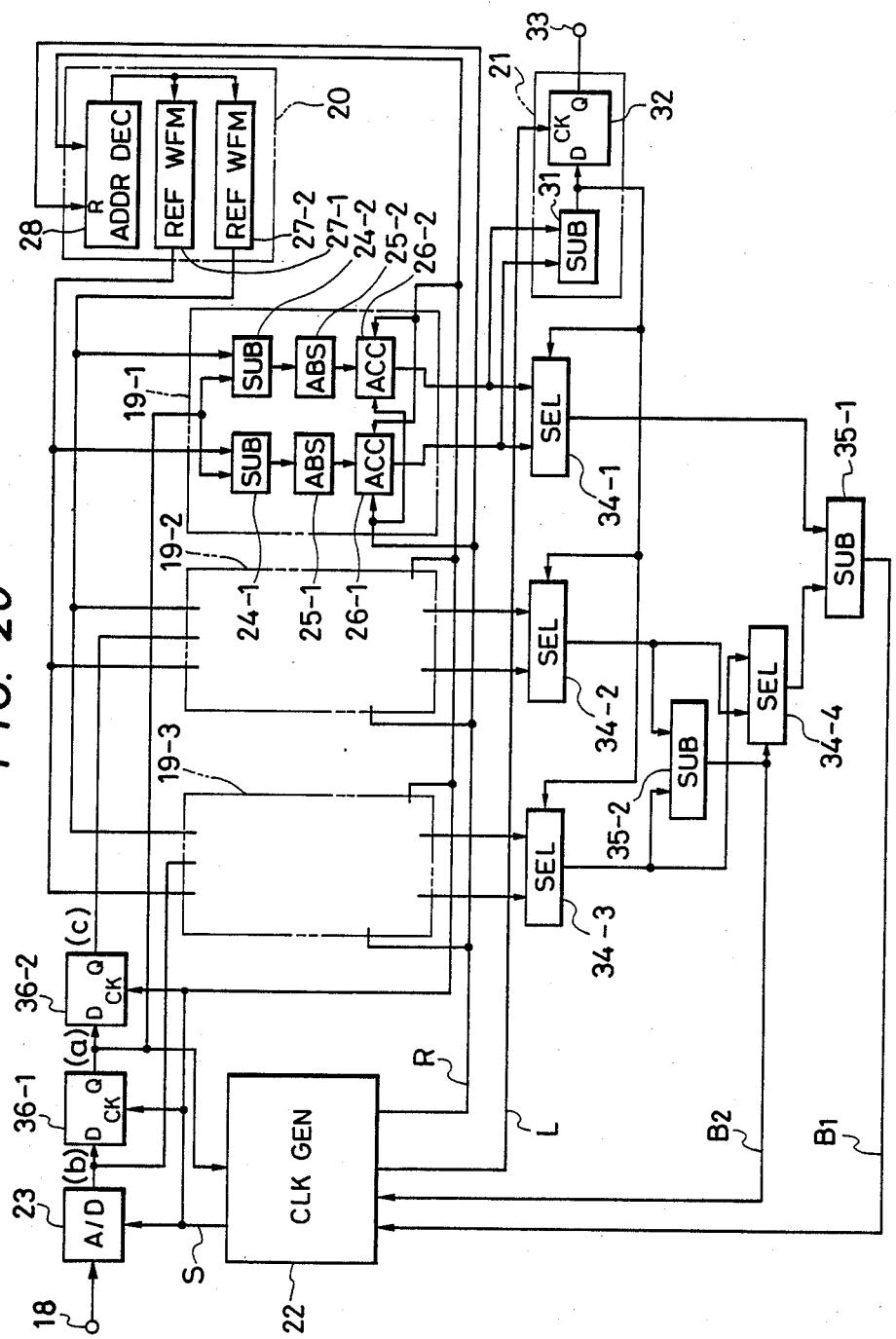
FIG. 20 is a block diagram illustrating a modified form of the decoding apparatus shown in FIG. 5, which is additionally equipped with a bit-synchronous correcting function based on the correlation of waveforms.

FIG. 20 illustrates a decoding apparatus in which circuits for bit synchronization are added to the arrangement shown in FIG. 5. The circuits added are D flip-flops 36-1 and 36-2, comparators 19-2 and 19-3, data selectors 34-1 to 34-4 and subtractors 35-1 and 35-2. The A/D converter 23 is provided outside the comparators 19-1 to 19-3, each of which is identical in construction with the waveform comparing section 19 except for the removal of the A/D converter 23 therefrom.

Figure 21A:
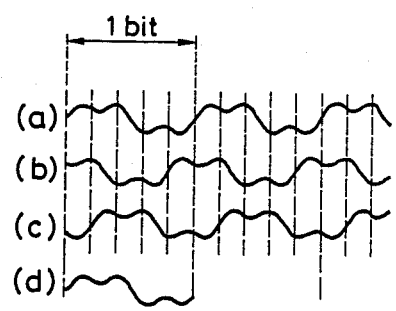
FIGS. 21A and 21B are waveform diagrams, for explaining the comparison of waveforms in FIG. 20.
Figure 21B:
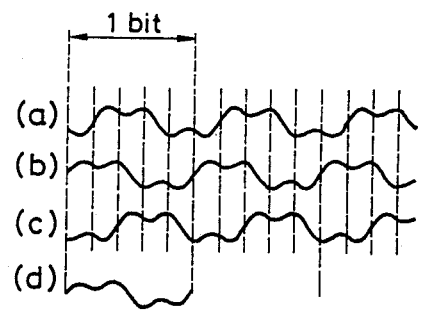
Figure 22A:
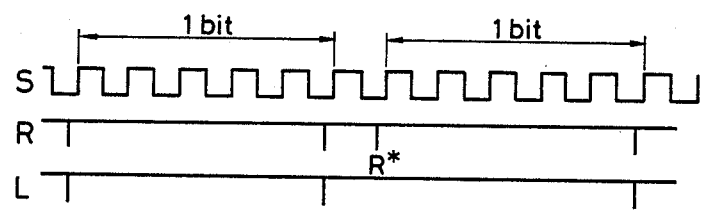
FIGS. 22A and 22B are timing charts, for explaining synchronous correction in FIG. 20.
Figure 22B:
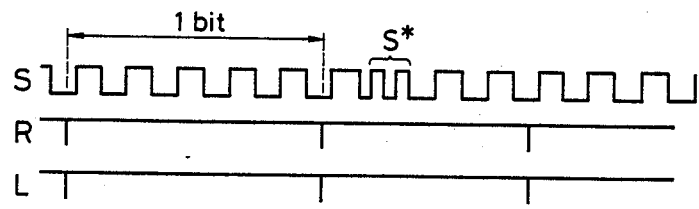

FIGS. 21A and 21B show the comparison of waveforms, (a), (b), (c) and (d) showing, by way of example, the output (a digital sample value) of the D flip-flop 36-1, the output of the A/D converter 23, the output of the D flip-flop 36-2 and the output of the reference waveform memory 27-1 or 27-2, respectively. FIGS. 22A and 22B show a synchronization correcting method for establishing bit synchronization by the output of the clock generating section 22. Reference character S indicates a sampling signal, R a reset signal, and L a latch signal.

The operating principle of the embodiment shown in FIG. 20 is to compare the reference waveform and the received waveform shifted ±1 sample relative to each other, detect a step out of bit synchronization and correct the synchronization. The clock generating section 22 yields the sampling signal S of a frequency n times higher than the information transmitting bit rate of the transmitting side, through use of a crystal oscillator. This sampling signal corresponds to signal S in FIG. 5.

In the above, n is the number of samples per bit. Of course, this oscillation frequency of the oscillator is selected very close to a value n times higher than the bit rate but is not synchronized with the transmission of information. The sampling signal S is provided at all times, on which the A/D converter 23 and the D flip-flops 36-1 and 36-2 operate at all times. The clock generating section 22 monitors the output (a) of the D flip-flop 36-1 and, when the output exceeds a fixed level (a digital value), determines that a received signal has been applied, and starts the generation of the reset signal R and the latch signal L. These signals are yielded every n samples, i.e. for each bit and correspond to the reset signal R in FIG. 5.

The received waveform digitized by the A/D converter 23 is delayed by one sample in each of the D flip-flops 36-1 and 36-2. The delayed output ((a) in Fig. 21A or 21B) of the D flip-flop 36-1 is applied to the comparator 19-1, wherein it is compared with reference waveforms read out of the reference waveform memories 27-1 and 27-2. The subtractor 31 in the decoded information output section 21 compares the two outputs from the comparator 19-1 and produces binary information "1" or "0" corresponding to a smaller one of them. This operation is exactly the same as that described previously in connection with FIG. 5. On the other hand, the output of the A/D converter 23 (the waveform one sample earlier than the output of the D flip-flop 36-1, shown in FIG. 21A(b) or 21B(b)) and the output of the D flip-flop 36-2 (the waveform delayed one sample behind the output of the D flip-flop 36-1, shown in FIG. 21A(c) or 21B(c)) are also provided in the comparators 19-2 and 19-3, wherein they are compared with reference waveforms read out of the reference waveform memories 27-1 and 27-2, respectively. The results of comparison between these three received waveforms shifted by 1 sample from one to another and the reference waveforms are provided to the data selectors 34-1 to 34-3, respectively, and according to the determination result by the subtractor 31 of the decoded information output section 21, the differences in area between the three received waveforms and one reference waveform which is determined by the subtractor 31 to have a closest resemblance to the received waveform are selectively output. That is, when "0" is decoded by the decoded information output section 21, the left-hand side input to each of the data selectors 34-1 to 34-3 is output therefrom. The three outputs of the data selectors 34-1 to 34-3 represent the differences in area, in the range of one bit, between the waveforms (a) to (c) and the reference waveform (d) shown in FIG. 21A. In the case of FIG. 21A, the waveform (a) most resembles the waveform (d), indicating bit synchronization has been established, so that the output of the data selector 34-1 is the smallest. In this state, since the output of the data selector 34-1 is smaller than the output of the data selector 34-4, the borrow output $B_1$ of the subtractor 35-1 is "0". In this state, since the transmission and reception are synchronized, the clock generating section 22 keeps on generating the above-noted signals S, L and R. The aforementioned comparison technique based on seeking the minimum areal difference between waveforms is similar to the correlation technique.

However, when the clock on the transmitting side and the clock on the receiving side are not particularly synchronized with each other, the bit synchronization is lost after certain elapsed time. Where the clock on the receiving side leads the clock on the transmitting side, the received waveforms become such as indicated by (a) to (d) in FIG. 21B. In this state, since the output waveform (b) of the A/D converter 23 most resembles the reference waveform (d) prestored in the reference waveform memory 27-1 or 27-2, the output of the data selector 34-3 becomes smaller than the outputs of the other data selectors 34-1 and 34-2. Consequently, the borrow output of the subtractor 35-2 goes to "1" and the output of the data selector 34-3 is provided at the output of the data selector 34-4. The outputs of the data selectors 34-4 and 34-1 are subtracted one from the other in the subtractor 35-1, but since the output of the data selector 34-4 is smaller than the output of the data selector 34-1, the borrow output $B_1$ of the subtractor 35-1 goes to "1". The clock generating section 22 yield the reset signal R and the latch signal L at the end of one bit and, at the same time, it reads thereinto the borrow outputs $B_1$ and $B_2$ of the subtractors 35-1 and 35-2. When the bit synchronization is lost, the borrow outputs $B_1$ goes to "1", from which the clock generating section 22 decides that synchronization is lost. Where the borrow output $B_2$ of the subtractor 35-2 is at "1" level, it is determined that the clock of the receiving side leads the clock of the transmitting side, whereas when the borrow output $B_2$ is at "0" level, it is determined that the clock of the receiving side lags the clock of the transmitting side. In the case of FIG. 21B, the borrow output $B_2$ of the subtractor 35-2 is at "1" and accordingly the receiving clock leads the transmitting clock, so that it is necessary only to discard one sample. To make this correction, the clock generated section 22 yields a reset signal R (indicated by R*) immediately before the second rise of the sampling signal S (S in FIG. 22A) after the generation of the usual reset signal R and latch signal L (R and L in FIG. 22A) but does not yield the latch signal L at this time. Starting at this time point, the clock generating section 22 will thereafter yield the reset signal R and the latch signal L for each bit. As described above, by one extra shot of the reset signal R, the receiving clock can be delayed by one sample, permitting the correction of the bit synchronization.

Conversely, when the receiving clock lags the transmitting clock, the output of the data selector 34-2 becomes the smallest. In this instance, the clock generating section 22 yields the sampling signal S twice in the ordinary one sample period, as indicated by S* in FIG. 22B, by which synchronization can be corrected. Of course, since the reset signal R and the latch signal L are always yielded after sampling five times, as indicated by R and L in FIG. 22B, the one bit period becomes four ordinary samples long when sampling correction is conducted.

Figure 23:
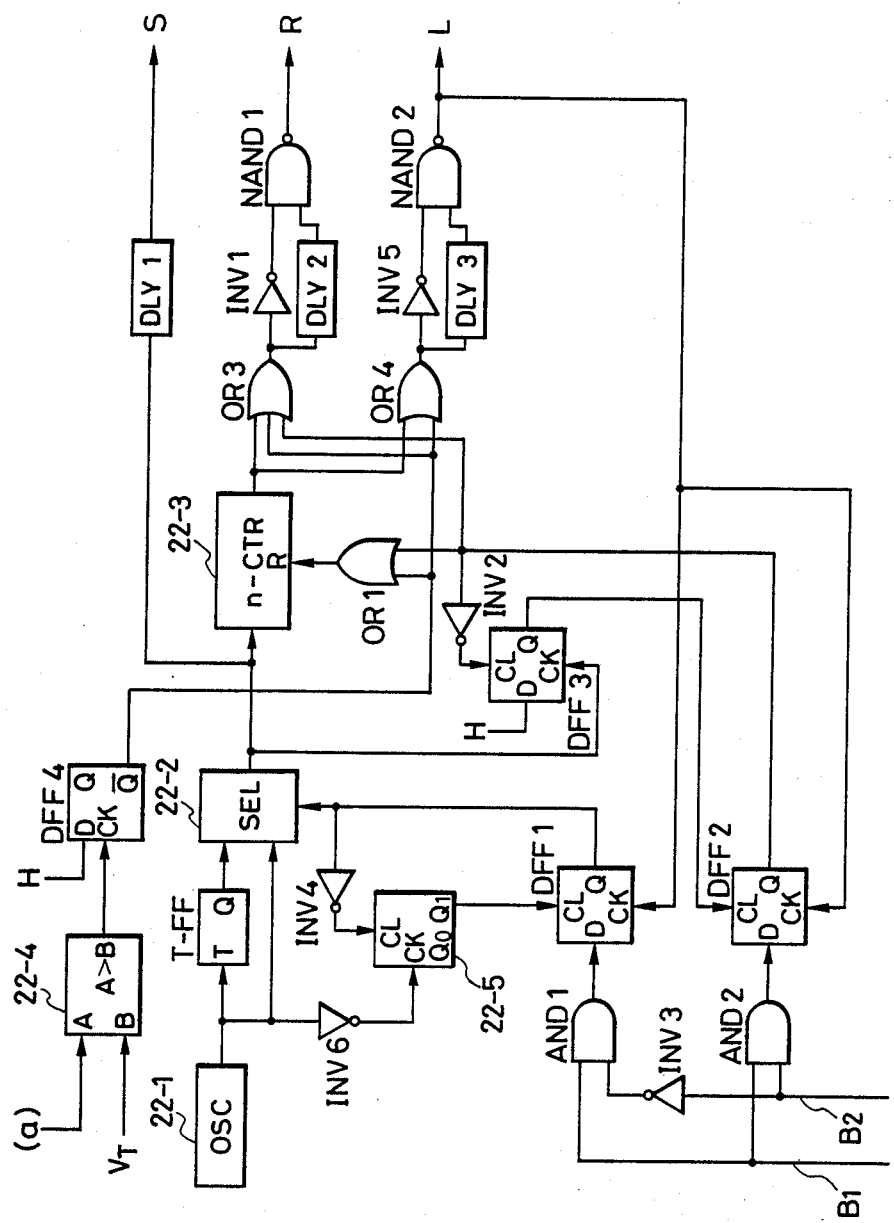
FIG. 23 is a circuit diagram showing an example of the arrangement of a clock generating section 22 used in FIG. 20.

FIG. 23 illustrates an example of the arrangement of the clock generating section 22 in the decoding apparatus depicted in FIG. 20. An oscillator 22-1 generates a clock of a frequency 2n times as high as the bit rate. A flip-flop T-FF frequency divides the clock down to ½ to produce a sampling signal S of a frequency n times as high as the bit rate. In the initial state all flip-flops and counters are held in their reset state.

In the initial state prior to the application of the received signal, a flip-flop DFF1 outputs "0" and the output of the flip-flop T-FF is output from data selector 22-2. This clock from the selector 22-2 is always output, as the sampling signal S, via a delay circuit DLY1 for adjusting the timing relative to the reset signal R. At this time, the output $\overline{Q}$ of a flip-flop DFF4 provides "1", an n-step counter 22-3 is held in the reset state, and the reset signal R and the latch signal L are not yielded.

The input at the input terminal 18 is always taken in by sampling and the output (a) of the D flip-flop 36-1 in FIG. 20 is applied to an input A of a digital comparator 22-4 in FIG. 23. When the value of the received signal level exceeds a trigger level $V_T$ set at an input B of the digital comparator 22-4, its output goes to "1" and the output $\overline{Q}$ of the flip-flop DFF4 goes to "0". As a result of this, outputs of OR gates OR3 and OR4 both go to "0", generating an initial reset signal R and an initial latch signal L. After this, the n-step counter 22-3 starts its operation, yielding the reset signal R and the latch signal L every n shots of the sampling signal S.

When the clock of the receiving side leads the clock of the transmitting side by one sample, the borrow signals $B_1$ and $B_2$ both go to "1s" and the output Q of a flip-flop DFF2 is made "1" by the latch signal L. By the Q output "1" of the flip-flop DFF2 the n-step counter 22-3 is reset and a flip-flop DFF3 starts its operation. When the clock input of the flip-flop DFF3 goes to "1", its output goes to "1", by which the flip-flop DFF2 is cleared, making its output "0". As a result of this, the output of the OR gate OR3 goes to "0", generating a reset correction signal R* and initiating the operation of the n-step counter 22-3. In this way, one shot of the reset signal R* for correction use, shown in FIG. 22A, is additionally generated and thereafter the reset signal R and the latch signal L are yielded every n samples.

When the clock of the receiving side lags that of the transmitting side by one sample, the borrow outputs $B_1$ and $B_2$ go to "1" and "0", respectively, and the latch signal L is applied to the flip-flop DFF1, making its output "1". As a result of this, the data selector 22-2 selects the direct output of the oscillator 22-1 and outputs therefrom a sampling signal of a two-fold frequency. At the same time, a binary two-stage counter 22-5 starts its operation and, when having counted the fall of the signal of the two-fold frequency twice, the counter 22-5 makes its $Q_1$ output "1", by which the flip-flop DFF1 is cleared, and the data selector 22-2 resumes to yield the ½-frequency divided output. In this way, an extra shot of a sampling signal for correction use, shown in FIG. 22B, is produced.

As described above, the bit synchronization can be obtained by making comparison between waveforms shifted before and after the received waveform and the reference waveforms, in addition to the waveform comparison described previously with regard to FIG. 5. With such a method, since no substantial operation time for pulling into synchronization is needed, unlike the conventional PLL which requires a considerable length of pulling time, the preamble can be omitted which has been used in the past for the establishment of synchronization, permitting reduction of the time for training. Even if the transmitted waveform is seriously distorted, synchronization can easily be established. Furthermore, the whole apparatus can be constituted by logic circuits, and hence can easily be fabricated as an LSI.

Figure 24:
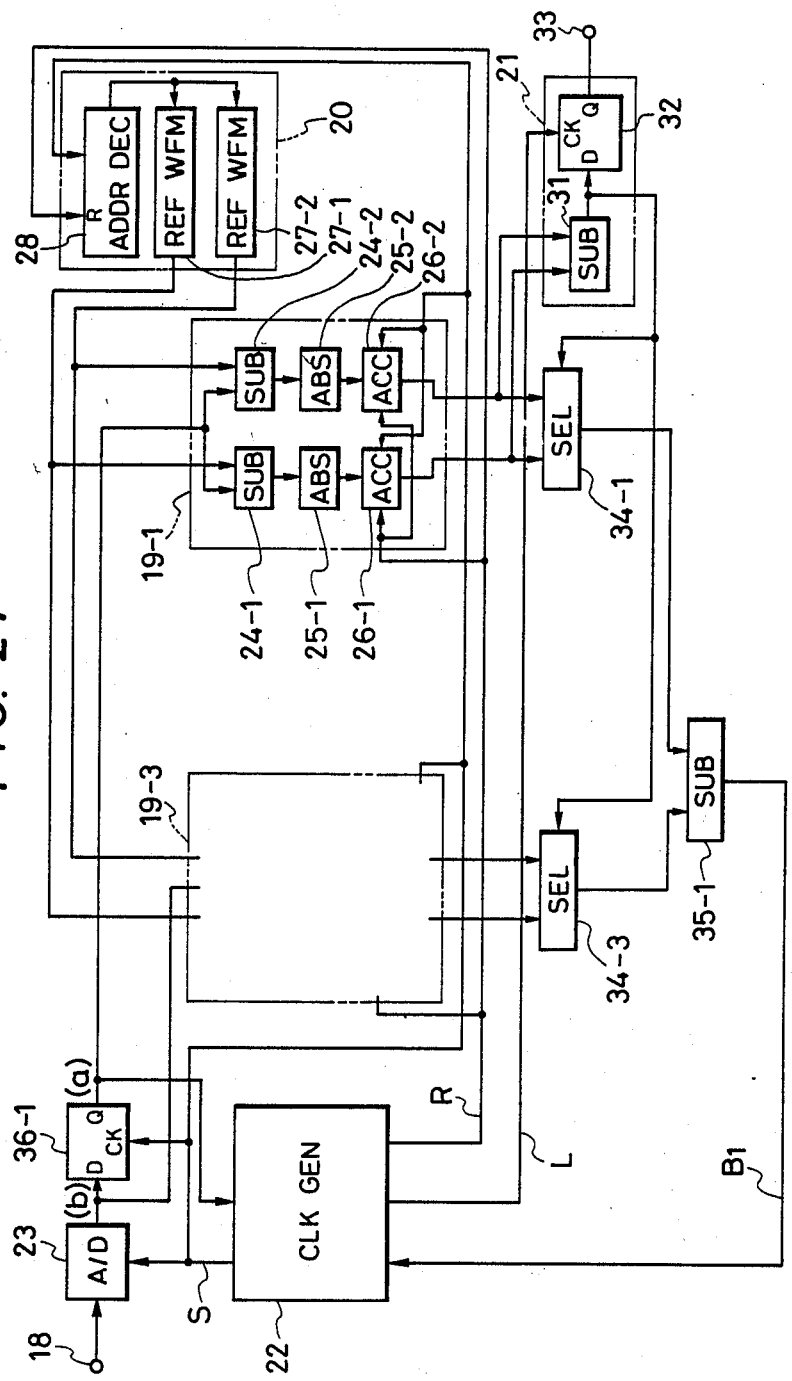
FIG. 24 is a block diagram illustrating a simplified form of the embodiment shown in FIG. 20.
Figure 25:
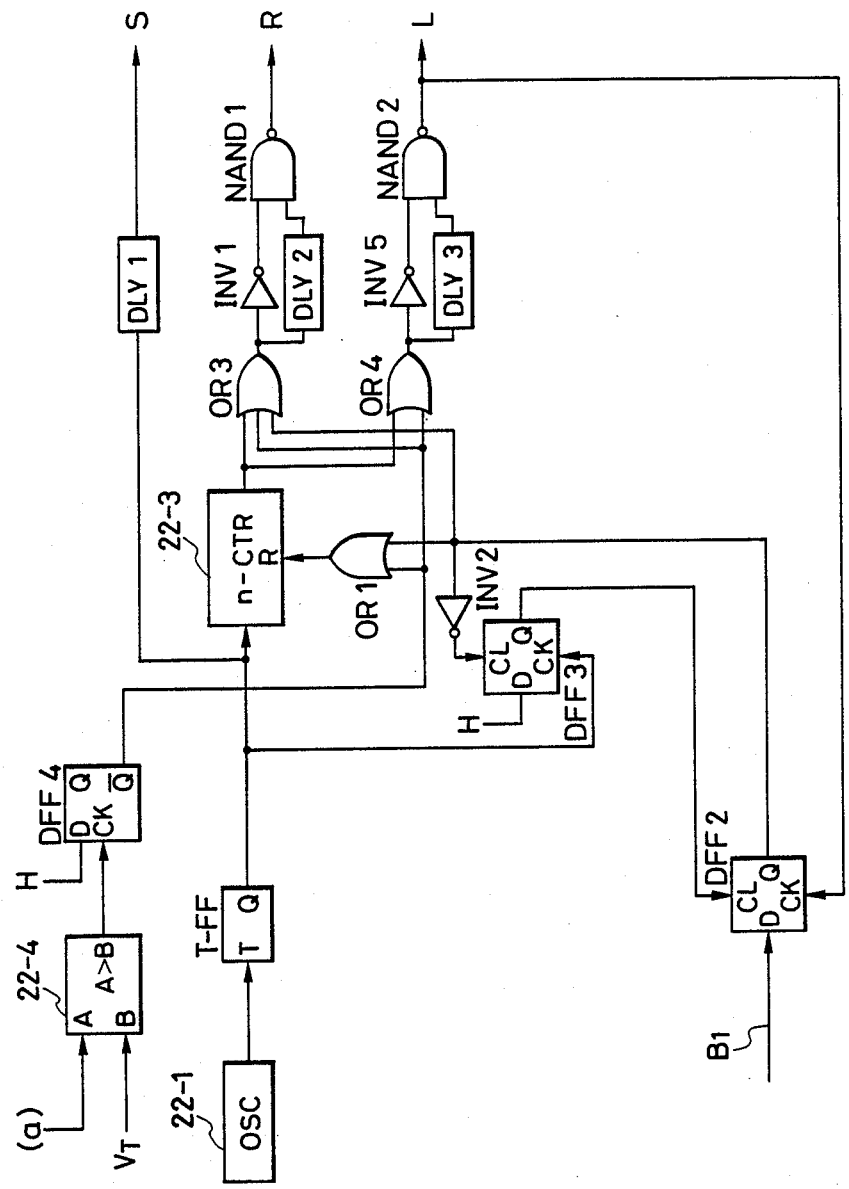
FIG. 25 is a circuit diagram showing an example of the clock generating section 22 used in FIG. 24.

FIG. 24 illustrates a simplified version of the decoding apparatus depicted in FIG. 20. In the decoding apparatus of FIG. 20, since it is not known whether the clock of the receiving side leads or lags that of the transmitting side, the comparator 19-3 detects the state where the clock of the receiving side leads that of the transmitting side, and the comparator 19-2 detects the state where the clock of the receiving side lags that of the transmitting side. However, for example, by presetting the clock of the receiving side to lead that of the transmitting side at all times, it is possible to omit the circuits for detecting the state where the clock of the receiving side lags that of the transmitting side. More specifically, the D flip-flop 36-2, the comparator 19-2, the data selectors 34-2 and 34-4, and the subtractor 35-2 shown in FIG. 20 can be left out, as shown in FIG. 24. Moreover, since the correction of the synchronization of the clock generating section 22 is sufficient with only the reset correction shown in FIG. 22A and does not call for the sample correction shown in FIG. 22B, the clock generating section 22 can also be simplified as depicted in FIG. 25. The operations in FIGS. 24 and 25 can easily be understood from the description given previously in connection with FIGS. 20 and 23, and hence will not be described. Of course, the decoding system can similarly be simplified even if the clock of the receiving side is preset to lag that of the transmitting side.

Figure 26:
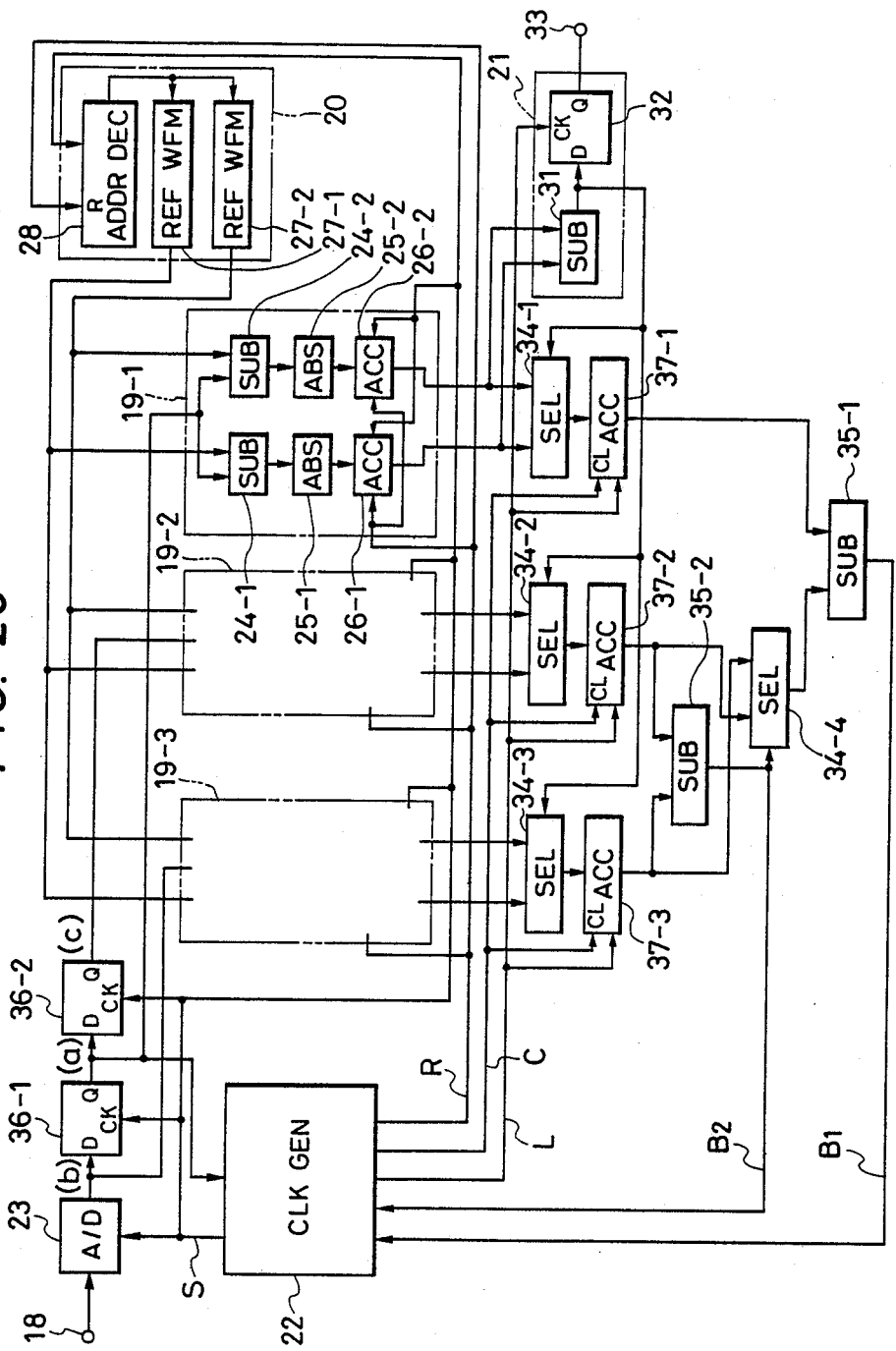
FIG. 26 is a block diagram illustrating a modified form of the decoding apparatus shown in FIG. 20, which is adapted for correlating waveforms for a plurality of bits.
Figure 27:
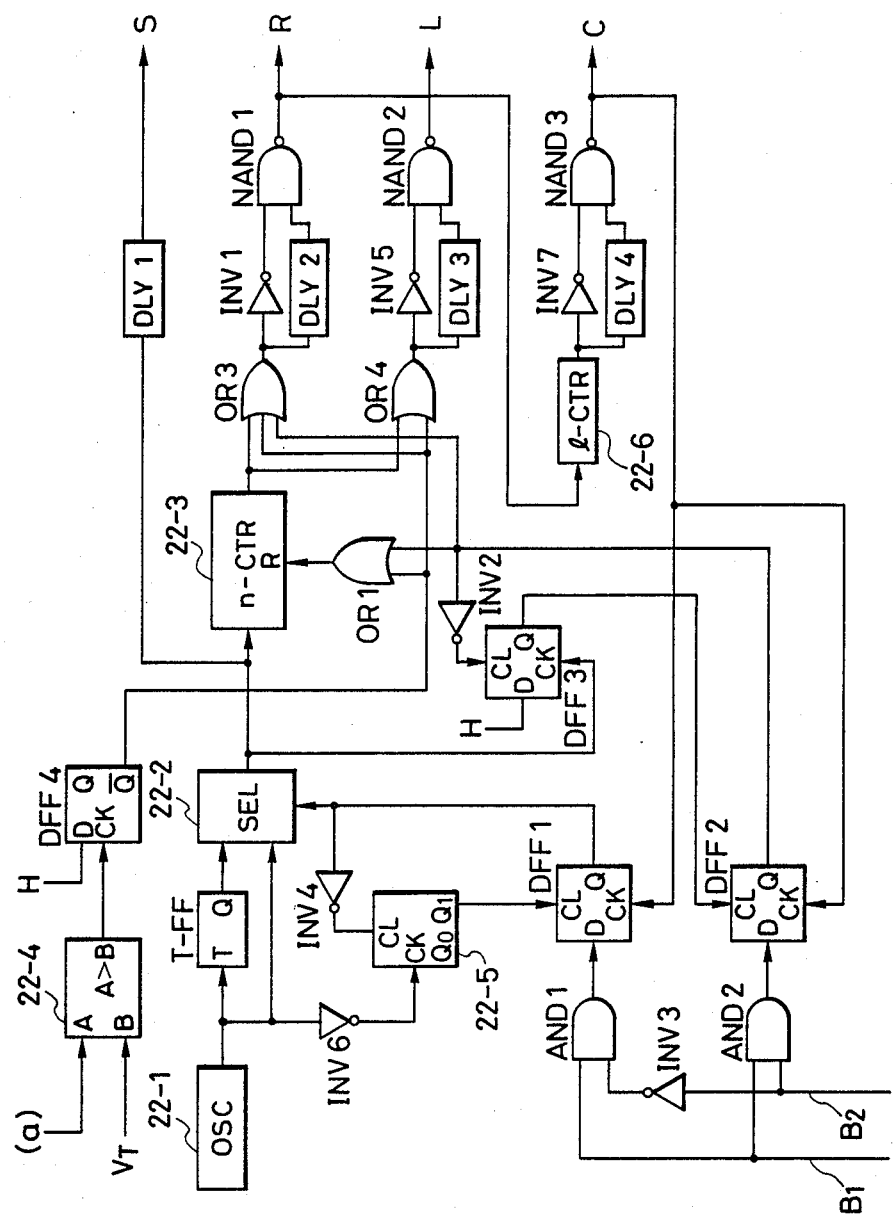
FIG. 27 is a circuit diagram showing an example of the arrangement of the clock generating section 22 utilized in FIG. 26.

In the method for establishing the bit synchronization through utilization of the correlation between waveforms as described above with reference to FIG. 20, the correlation is obtained for each bit. It is also possible to employ methods in which the correlation is obtained for a span of a plurality of bits, for example, 8 or 16 bits. With such a method, the bit synchronization can be established even in the case where the received waveform is distorted by the characteristic of the transmission line or the like and undergoes substantially no level change for the duration of one bit. FIG. 26 shows the arrangement of a decoding apparatus which performs this method, and FIG. 27 shows its clock generating section 22 therefor. The decoding apparatus has an arrangement in which accumulators 37-1 to 37-3 for accumulating the outputs of the data selectors 34-1 to 34-3, l times, are added to the arrangement of FIG. 20 and an l-step counter 22-6 for counting the number of reset signals R as the number of accumulations, l, is added to the clock generating section 22 shown in FIG. 23. In FIG. 27, whenever the counter 22-6 has counted the number of reset signals l times, the clear signal C is obtained from its overflow and is applied to clock terminals of the flip-flops DFF1 and DFF2, by which the borrow outputs $B_1$ and $B_2$ are taken into these flip-flops, correcting the clock synchronization. The clear signal C is provided to the accumulators 37-1 to 37-3 in FIG. 26, resetting their accumulated contents every l information bits. In this fashion, the correlation between the received waveform and the reference waveform is obtained for l bits, and based on the results obtained, the synchronization can be corrected. No further detailed description will be given for the sake of brevity.

While the clock synchronizing method has been described with respect to the embodiment shown in FIG. 5, it is needless to say that a similar method can be applied to the other embodiments as well.

As described above, the decoding apparatus of the present invention prestores, as reference waveforms, received waveforms corresponding to information to be transmitted and decodes transmitted information by comparing its received waveform with the prestored reference waveforms, and accordingly the decoding is not virtually affected by the deterioration of the received waveform. Furthermore, the decoding apparatus of the present invention is capable of dealing with a change in the transmission characteristic simply by changing the reference waveform that is used for comparison, and hence is highly flexible and easy of design.

Moreover the decoding apparatus can be formed by accumulators and subtractors, without using any multipliers, and hence is highly economical and capable of high-speed operation.

In the case of transmission over several hundred meters, training of the receiving characteristic of the decoding apparatus can be achieved by sending as short a training pattern as 10 to 20 bits. Accordingly, the present invention permits very efficient transmission of short packets through LAN or the like.

Moreover, the decoding apparatus of the present invention can also be used with a nonlinear transmission system because waveforms themselves are compared. This means that decoding can be achieved even if the A/D converter of the receiver used is saturated, and the level of the receiver needs only to be preset to the lowest received signal level, eliminating the necessity of effecting level control such as AGC. This not only simplifies the circuit arrangement of the apparatus but also saves the time for level setting and hence reduces the time for training.

In addition, since the bit synchronization is obtained from the correlation between waveforms, there is no need of sending a special signal for the synchronization, prior to the transmission of information. This also serves to reduce the time for training.

While in the above the decoding apparatus of the present invention has been described in connection with a metallic cable, it can be used regardless of the kind of transmission system used. That is, the decoding apparatus can be applied to wire transmission systems which employ metallic, coaxial, optical fiber and similar cables, and wireless transmission systems which utilize light, electromagnetic waves such as microwave, millimeter wave, etc., and sound waves such as ultrasonic waves. Further, the decoding apparatus of the present invention is applicable as well to a transmission system which employs a combination of these transmission media. Besides, the decoding apparatus can be used as a desired digital transmission system such as a modem for use in a telephone network and a transmission system for forming a digital network and a tranceiver of LAN.

It will be apparent that many modifications and variations may be effected without departing from the scope of the novel concepts of the present invention.

What is claimed is:

1. A digital code decoding apparatus which receives and decodes a transmitted digital code information, comprising:
   reference waveform storage means for storing at least m reference waveforms corresponding to m-value codes which form the digital code information, where m is an integer equal to or greater than 2;
   waveform comparing means for comparing an input received waveform with at least said m reference waveforms read out of said reference waveform storage means and yielding at least m compared outputs;
   decoded information output means for determining one of said reference waveforms which most resembles the received waveform, on the basis of the compared outputs from said waveform comparing means, and yielding, as decoded information, one of the digital codes corresponding to the said one reference waveform determined to most resemble the received waveform; and
   clock generating means for generating a clock of a frequency higher than the bit rate of the digital code information and generating a reset signal every predetermined number of clocks, said reference waveform storage means including address decoder means for generating addresses for reading out said reference waveforms, said address decoder means incrementing the addresses upon each generation of the clock and resetting the addresses in response to said reset signal.

2. The decoding apparatus of claim 1, further comprising:
A/D converting means which receives the clock as a sampling signal and converts the received waveform into digital form at intervals of a sampling period of said sampling signal; and
write control means for successively writing into said reference waveform storage means the received waveforms which have been converted into digital form through said A/D converting means and which correspond to the respective m-value codes.

3. The decoding apparatus of claim 1 or 2, wherein said reference waveform storage means includes at least m reference waveform memories for storing at least said m reference waveforms.

4. The decoding apparatus of claim 3, wherein said waveform comparing means includes:
at least m subtracting means for obtaining at least m differences between sample values of the respective reference waveforms read out of said at least m reference waveform memories and sample values of the received waveform;
at least m absolute value generating means for obtaining the absolute values of said at least m differences obtained by said at least m subtracting means in corresponding relation to said m reference waveforms; and
at least m accumulating means whereby the absolute values from said at least m absolute value generating means in corresponding relation to the respective reference waveforms are successively accumulated upon each generation of the sampling signal and are output as at least m compared result values, said at least m accumulating means being reset by the reset signal.

5. The decoding apparatus of claim 4, wherein said decoded information output means includes code discriminating means for comparing the compared result values from said at least m accumulating means with one another, determining one of the reference waveforms which provided the smallest compared result value to resemble most to the received waveform, and yielding a digital code corresponding to the said one reference waveform.

6. The coding apparatus of claim 1, wherein said waveform comparing means includes at least m subtracting means for producing the absolute values of the differences between the received waveform and said at least m reference waveforms, said waveform comparing means yielding the absolute values of said at least m differences as the compared outputs.

7. The decoding apparatus of claim 1, wherein said reference waveform storage means includes a plurality of reference waveform memories for storing a plurality of the reference waveforms for each code of the m-value codes.

8. The decoding apparatus of claim 7 further comprising:
A/D converting means which receives the clock as a sampling signal and converts the received waveform into digital form at a sampling period of said sampling signal; and
write control means for successively writing into said plurality of reference waveform memories the plurality of reference waveforms in digital form for each of m possible values of the m-value codes.

9. The decoding apparatus of claim 2 or 8, wherein said write control means includes output inhibit means for inhibiting the output of said decoded information output means during the write of said reference waveforms into said reference waveform storage means.

10. The decoding apparatus of claim 7 further comprising waveform selecting means, said waveform selecting means including:
a k-bit shift register which shifts upon each application thereto of the latest decoded information, where k is equal to or greater than 1; and
gate means which is supplied with the output of each stage of said shift register, for selecting, based on the output contents thereof, m reference waveforms corresponding to m possible values of the m-value codes from said reference waveform memories, and supplying said selected reference waveforms to said waveform comparing means.

11. The decoding apparatus of claim 1 wherein said reference waveform storage means includes m reference waveform memories corresponding to m possible values of the m-value codes, each of said m reference waveform memories storing a plurality of the reference waveforms corresponding to one of said m possible values of the m-value codes corresponding thereto;
said decoding apparatus further comprising:
a k-bit shift register which shifts upon each application thereto of the latest decoded information, where k is equal to or greater than 1; and
waveform selecting means which is supplied with the output of each stage of said shift register and simultaneously specifies the reference waveforms to be read out of said m reference waveform memories in accordance with the contents of the shift register outputs.

12. The decoding apparatus of claim 10 or 11, wherein said waveform selecting means includes:
m subtracting means for obtaining, upon each generation of the clock, the difference between each sample value of said m read-out reference waveforms and the sample value of the received waveform;
m absolute value generating means for obtaining the absolute values of said m differences obtained by said m subtracting means; and
m accumulating means which successively accumulate said m absolute values from said m absolute value generating means upon each generation of the clock and outputs m compared result values, said m accumulating means being reset by the reset signal.

13. The decoding apparatus of claim 10 or 11, further comprising:
A/D converting means which receives the clock as a sampling signal and converts the received waveform into digital form at intervals of the sampling period; and
write control means for successively writing in digital form into said reference waveform storage means the plurality of reference waveforms corresponding to each of said m possible values of the m-value codes.

14. The decoding apparatus of claim 13, wherein said decoded information output means includes code discriminating means for comparing said m compared result values corresponding to said m reference waveforms with one another, determining one of said reference waveforms which provided the smallest compared result value to most resemble said received waveform, and yielding a digital code corresponding to the said one reference waveform.

15. The decoding apparatus of claim 14, wherein said decoded information output means includes latch means for latching the code discriminated by said code discriminating means, in synchronism with the reset signal, and outputting the latched code as a decoded code from said decoded information output means.

16. The decoding apparatus of claim 1, further comprising:
first delay means for delaying the received waveform for a predetermined time;
first waveform comparing means connected to either one of the input and output sides of said first delay means, said first waveform comparing means constituting said waveform comparing means;
second waveform comparing means connected to the other of the input and output sides of said first delay means, for comparing the received waveform with said at least m reference waveforms, said second waveform comparing means being identical in construction with said first waveform comparing means; and
synchronism detecting means whereby it is determined, on the basis of the compared outputs from said first and second waveform comparing means, whether or not any one of the reference waveforms and the received waveform are synchronized with each other in said first waveform comparing means, producing and if not, an asynchronism detection signal;
wherein said clock generating means responds to the asynchronism detection signal from said synchronism detecting means to control the number of generations of at least one of the clock and the reset signal, thereby correcting the synchronism between the said one of the reference waveforms and the received waveform in said first waveform comparing means.

17. The decoding apparatus of claim 16 wherein the frequency of the clock is n times higher than the bit rate of the digital code information, where n is an integer equal to or greater than 2, and said clock generating means includes:
level comparing means for detecting the start of the reception of the information;
counter means for generating the reset signal upon each counting of the clock n times;
initial reset signal generating means responsive to the output of said level comparing means to reset said counter means and generate a first reset signal; and
reset correcting signal generating means responsive to the asynchronis detection signal from said synchronism detecting means to reset said counter means and control the number of generations of the reset signal.

18. The decoding apparatus of claim 16, wherein the frequency of the clock is n times higher than the bit rate of the digital code information, where n is an integer equal to or greater than 2, and said clock generating means includes:
level comparing means for detecting the start of the reception of the information;
counter means for generating the reset signal upon each counting of the clock n times;
initial reset signal generating means responsive to the output of said level comparing means to reset said counter means and generate a first reset signal; and
clock correcting signal generating means responsive to the asynchronism detection signal from said synchronism detecting means to control the number of generations of the clock.

19. The decoding apparatus of claim 17 or 18, wherein compared result accumulating means is provided between each of said first and second waveform comparing means and said synchronism detecting means, for successively accumulating the compared outputs from each of said first and second waveform comparing means; said synchronism detecting means compares the accumulated outputs of said comparing result accumulating means to detect asynchronism; said clock generating means includes clear signal generating means for generating a clear signal upon each counting of the reset signal a predetermined number of times; and the clear signal is applied to each of said compared result accumulating means to clear its contents.

20. The decoding apparatus of claim 16, wherein said reference waveform storage means includes ar least m reference waveform memories for storing the at least m reference waveforms;
wherein said first and second waveform comparing means each include at least m subtracting means for obtaining the differences between the reference waveforms read out of said at least m reference waveform memories and the received waveform, at least m absolute value generating means for obtaining the absolute values of the at least m differences corresponding to the reference waveforms, respectively, and at least m accumulating means which successively accumulate said at least m absolute values corresponding to the reference waveforms and output at least m compared result values, said m accumulating means being reset by the reset signal; and
wherein said synchronism detecting means includes first and second data select means connected to the outputs of said first and second waveform comparing means, respectively, for selecting one of said at least m compared result values of said first and second waveform comparing means in accordance with the decoded information yielded by said decoded information output means, and synchronism comparing means for comparing the two compared result values selected by said first and second data select means to determine whether or not the transmission and reception of the information are synchronized.

21. A digital code decoding apparatus which receives and decodes a transmitted digital code information comprising:
reference waveform storage means for storing at least 2×m reference waveform corresponding to m-value codes which form the digital code information, where m is an integer equal to or greater than 2;
waveform comparing means for comparing an input received waveform with a set of m reference waveforms read out of said reference waveform storage means and yielding m compared outputs;

decoded information output means for determining one of said reference waveforms which most resembles the received waveform, on the basis of the compared outputs from said waveform comparing means, and yielding, as decoded information, one of the digital codes corresponding to the said one reference waveform determined to most resemble the received waveform; and waveform selecting means for selecting a specific set of m reference waveforms which is to be read out of said reference storage means for comparison with a received waveform next, in accordance with the decoded information from said decoded information output means.

22. The decoding apparatus of claim 21 further comprising write control means whereby a series of received waveforms of a training pattern appended to the beginning of the transmitted information are written, as said at least 2×m reference waveforms, into said reference waveform storage means in a predetermined order.

23. A digital code decoding apparatus which receives and decodes a transistor digital code information, comprising:

reference waveform storage means for strong at least m reference waveforms corresponding to m-value codes which form the digital code information, where m is an integer equal to or greater than 2;

waveform comparing means for comparing an input received waveform with all of said at least m reference waveforms read out of said reference waveform storage means and yielding at least m compared outputs;

decoded information output means for determining one of said reference waveforms which most resembles the received waveform, on the basis of the compared outputs from said waveform comparing means, and yielding, as decoded information, one of the digital codes corresponding to the said one reference waveform determined to most resemble the received waveform; and write control means whereby a series of received waveforms of a training pattern appended to the beginning of the transmitted information are written, as said at least m reference waveforms, into said reference waveform storage means in a predetermined order.

* * * * *